(12) United States Patent
Kishimoto

(10) Patent No.: US 10,658,627 B2
(45) Date of Patent: May 19, 2020

(54) METHOD FOR MANUFACTURING A DISPLAY APPARATUS

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 15/763,201

(22) PCT Filed: Sep. 7, 2017

(86) PCT No.: PCT/JP2017/032305
§ 371 (c)(1),
(2) Date: Sep. 13, 2018

(87) PCT Pub. No.: WO2019/049275
PCT Pub. Date: Mar. 14, 2018

(65) Prior Publication Data
US 2019/0259976 A1 Aug. 22, 2019

(51) Int. Cl.
*H05K 3/00* (2006.01)
*H01L 51/56* (2006.01)
(Continued)

(52) U.S. Cl.
CPC ........ *H01L 51/56* (2013.01); *G02F 1/133305* (2013.01); *G02F 1/133308* (2013.01);
(Continued)

(58) Field of Classification Search
CPC ......... G02F 1/133305; G02F 1/133308; G09F 9/30; G09F 9/00; H01L 27/3244; H01L 51/0097; H01L 51/5237; H01L 51/56
See application file for complete search history.

(56) References Cited

U.S. PATENT DOCUMENTS

| | | | |
|---|---|---|---|
| 2001/0042262 A1 | 11/2001 | Chu | |
| 2006/0125364 A1* | 6/2006 | Takeda | H05K 5/02 313/46 |

(Continued)

FOREIGN PATENT DOCUMENTS

| | | |
|---|---|---|
| JP | 2000305477 A | 11/2000 |
| JP | 2004069766 A | 3/2004 |

(Continued)

OTHER PUBLICATIONS

English Translation of PCT International Search Report, PCT Application No. PCT/JP2017/032305, Japan Patent Office. dated Nov. 28, 2017.

*Primary Examiner* — Paul D Kim
(74) *Attorney, Agent, or Firm* — Snell & Wilmer, L.L.P.

(57) ABSTRACT

A method for manufacturing display apparatus comprises: forming a display panel by forming a plurality of display elements on a substrate having flexibility; providing a holding member at a part of or the entire of an outer edge of the display panel along the outer edge, the holding member engaging with an outer periphery of the display panel; preparing a supporting member having a surface on which the substrate of the display panel is to be placed; placing the substrate on the surface of the supporting member; bonding the holding member to the surface of the supporting member; and bringing the substrate into close contact with the surface of the supporting member at a strength lower than a bonding strength between the holding member and the surface of the supporting member.

1 Claim, 13 Drawing Sheets

(51) Int. Cl.
  *G02F 1/1333* (2006.01)
  *H01L 51/00* (2006.01)
  *H01L 51/52* (2006.01)
  *G09F 9/00* (2006.01)
  *G09F 9/30* (2006.01)
  *H01L 27/32* (2006.01)

(52) U.S. Cl.
  CPC .................. *G09F 9/00* (2013.01); *G09F 9/30* (2013.01); *H01L 51/0097* (2013.01); *H01L 51/5237* (2013.01); *G02F 2001/133325* (2013.01); *G02F 2202/28* (2013.01); *H01L 27/3244* (2013.01); *H01L 2251/5338* (2013.01)

(56) References Cited

U.S. PATENT DOCUMENTS

| | | | | |
|---|---|---|---|---|
| 2008/0180626 | A1* | 7/2008 | Lee | G02F 1/13452 349/151 |
| 2009/0002924 | A1* | 1/2009 | Nakanishi | H05K 5/02 |
| 2010/0048249 | A1* | 2/2010 | Furuta | H04M 1/0214 455/566 |
| 2013/0321717 | A1* | 12/2013 | Kuromizu | G02F 1/133608 348/790 |
| 2014/0264300 | A1 | 9/2014 | Kamiya | |
| 2015/0380682 | A1 | 12/2015 | Kamiya | |
| 2017/0047384 | A1 | 2/2017 | Kamiya | |
| 2017/0047549 | A1 | 2/2017 | Kamiya | |
| 2018/0047939 | A1 | 2/2018 | Kamiya | |

FOREIGN PATENT DOCUMENTS

| | | |
|---|---|---|
| JP | 2004126451 A | 4/2004 |
| JP | 2005275053 A | 10/2005 |
| JP | 2007271894 A | 10/2007 |
| JP | 2008165132 A | 7/2008 |
| JP | 2014179278 A | 9/2014 |
| JP | 2015161818 A | 9/2015 |
| JP | 2016097650 A | 5/2016 |

* cited by examiner

METHOD FOR MANUFACTURING A DISPLAY APPARATUS

CROSS-REFERENCE TO RELATED APPLICATIONS

This patent application is a U.S. National Stage of PCT/JP2017/032305, filed on Sep. 7, 2017.

TECHNICAL FIELD

The present disclosure relates to a method for manufacturing display apparatus.

BACKGROUND ART

In recent years, in the field of flat panel display including for example, liquid crystal display apparatus and organic EL display apparatus, as the thinning is in progress, a flexible display panel formed with very thin glass substrate or film-like substrate as a base plate for display element starts to become popular. A flexible display panel or an extremely thin display panel is used in a state in which the display panel is bonded to, for example, a surface of a supporting member having an appropriate rigidity in order to obtain a shape retaining property for retaining a suitable shape for a use thereof or a mechanical strength. For example, in Patent Document 1, there is disclosed a method for bonding an image display panel such as a liquid crystal display panel with a window glass used for digital signage. In the method disclosed in Patent Document 1, an image display panel disposed to be spaced from a window glass via an elastic member or the like is pressed towards the window glass while being elastically deformed by rolling of a roller from one end to the other end of the image display panel. Consequently, the image display panel and the window glass are bonded with each other via a layer including a photo-curable resin.

PRIOR ART DOCUMENT

Patent Document

Patent Document 1: JP 2016-97650 A

SUMMARY OF THE INVENTION

Problem to be Solved by the Invention

As described above, conventionally, a display panel is bonded with a supporting member such as a window glass by using an adhesive including a resin to be cured by light or a heat. For example, the display panel and the supporting member are rigidly bonded with each other by using an adhesive used in bonding of a polarization plate or a touch panel in manufacture of a display apparatus. However, the display panel and the supporting member are rigidly bonded with each other and thus it is very difficult to detach, from the supporting member, the display panel that is once bonded with the supporting member. Even if the display panel could be detached, debris of the adhesive or remains of the display panel or the supporting member are left on each bonding surface and thus the display panel or the supporting member cannot be easily reused. Therefore, even in a case where a defect occurs with only either one of the display panel and the supporting member, both of them need to be discarded or replaced. For example, in a case where the supporting member is a window glass, when the window glass breaks, the display panel should be discarded along with the window glass even if the display panel maintains normal condition, and when a defect occurs with the display panel, the window glass should be discarded along with the display panel. In particular, in a case where the supporting member is a windshield for vehicle, it is difficult to request, for example, the manufacturer to repair the display panel bonded with the windshield, and thus even in a case where repairing is possible, there may be a case in which both of the display panel and the expensive windshield need to be replaced.

Accordingly, an object of the present disclosure is to provide a method for manufacturing display apparatus in which a display panel to be used being fixed to a supporting member can be easily detached from the supporting member.

Means to Solve the Problem

A method for manufacturing display apparatus according to Embodiment 1 of the present invention comprises: forming a display panel by forming a plurality of display elements on a substrate having flexibility; providing a holding member at a part of or the entire of an outer edge of the display panel along the outer edge, the holding member engaging with an outer periphery of the display panel; preparing a supporting member having a surface on which the substrate of the display panel is to be placed; placing the substrate on the surface of the supporting member; bonding the holding member to the surface of the supporting member; and bringing the substrate into close contact with the surface of the supporting member at a strength lower than a bonding strength between the holding member and the surface of the supporting member.

Effects of the Invention

According to the embodiment of the present invention, there can be provided a display apparatus in which a display panel to be used being fixed to a supporting member can be easily detached from the supporting member.

EMBODIMENT FOR CARRYING OUT THE INVENTION

Next, a method for manufacturing display apparatus of the present disclosure will be described with reference to the drawings. Material, shape, size of the constituent elements, and their relative positions illustrated in the embodiments described below are merely illustrative. The method for manufacturing display apparatus of the present disclosure is not construed to be limitative thereto.

Embodiment 1

Figure 1:
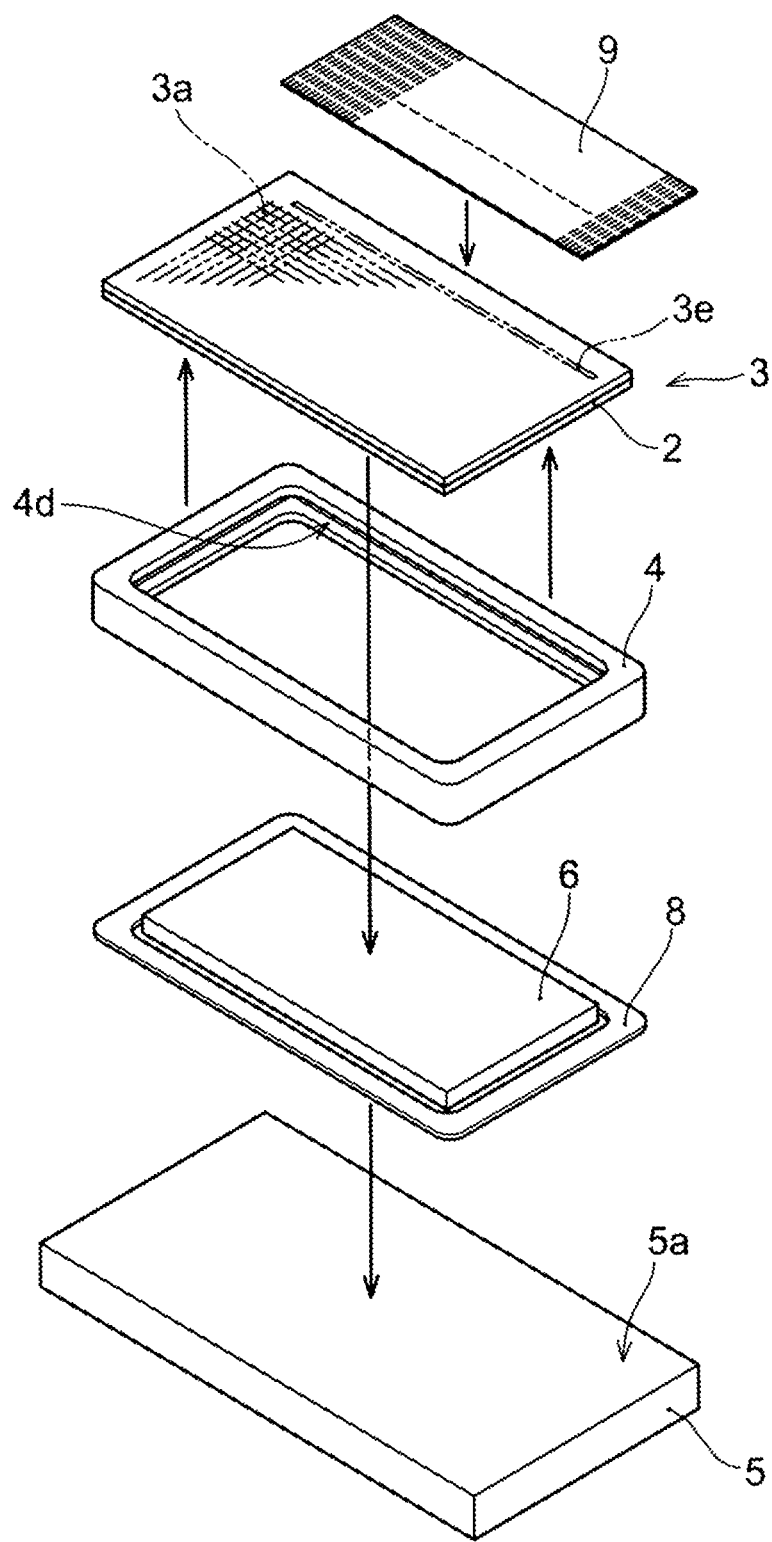
FIG. 1 shows an example of a method for manufacturing display apparatus according to Embodiment 1 of the present invention.

In FIG. 1, there is shown an exploded view of a display apparatus, which shows an example of a method for manufacturing display apparatus according to Embodiment 1. As shown in FIG. 1, the method for manufacturing display apparatus according to the present embodiment comprises: forming a display panel 3 by forming a plurality of display elements 3a on a substrate 2 having flexibility; and providing a holding member 4 at a part of or the entire of an outer edge of the display panel 3 along the outer edge of the display panel 3, the holding member 4 engaging with an outer periphery of the display panel 3. FIG. 1 shows an example of providing the holding member 4 at the entire of the outer edge of the display panel 3. The method for manufacturing display apparatus according to the present embodiment further comprises: preparing a supporting member 5 having a surface 5a on which the substrate 2 of the display panel 3 is to be placed; placing the substrate 2 on the surface 5a of the supporting member 5; bonding the holding member 4 to the surface 5a of the supporting member 5; and bringing the substrate 2 into close contact with the surface 5a of the supporting member 5 at a strength lower than a bonding strength between the holding member 4 and the surface 5a of the supporting member 5. In addition, the method for manufacturing display apparatus according to the present embodiment, as shown in FIG. 1, may further comprise forming a weak adhesive layer 6 composed of an adhesive agent on the surface 5a of the supporting member 5 or on a surface of the substrate 2 opposite to a surface facing the display elements 3a. In that case, the substrate 2 may be brought into close contact with the surface 5a of the supporting member 5 via the weak adhesive layer 6.

Figure 2:
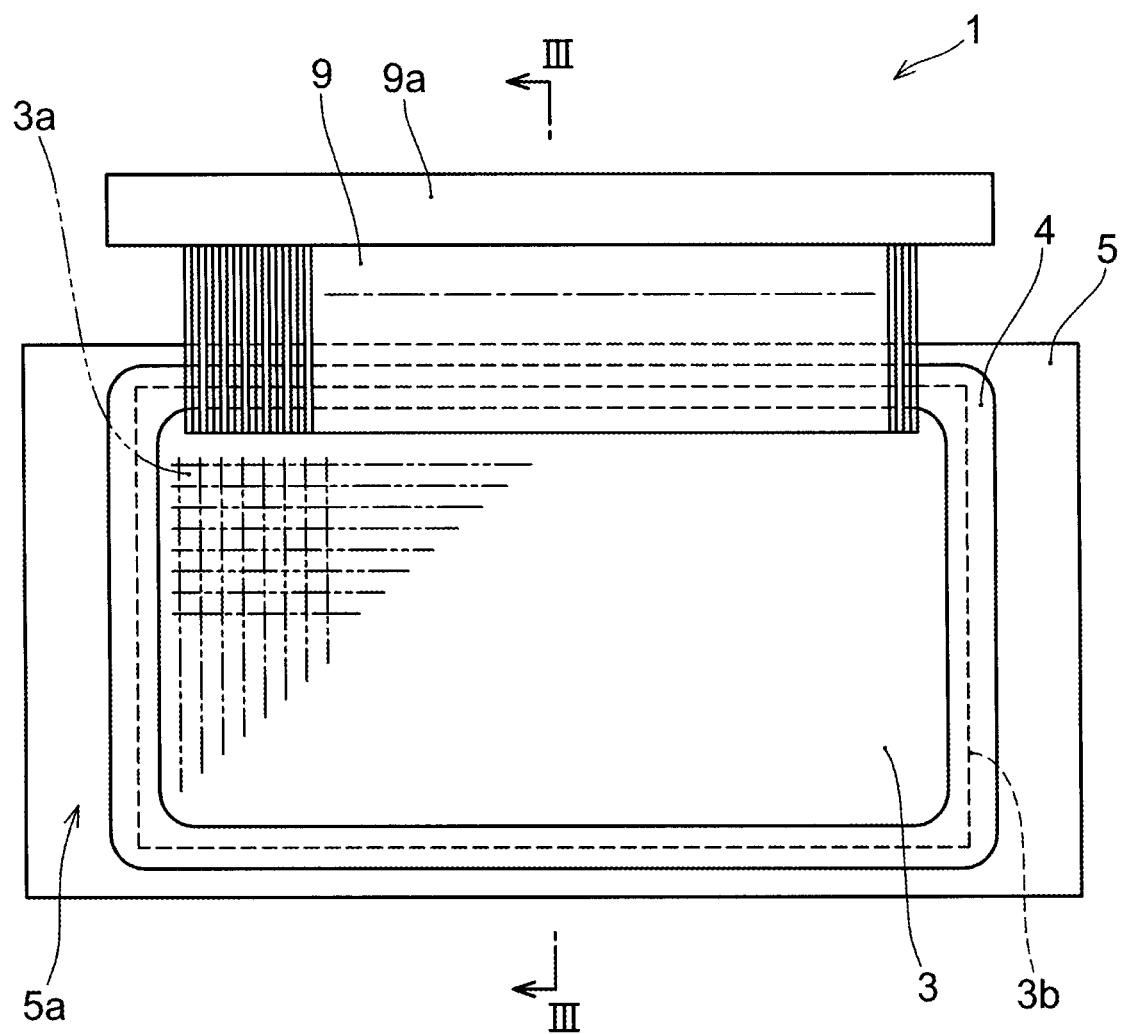
FIG. 2 shows a front view of an example of a display apparatus manufactured by the method for manufacturing display apparatus according to Embodiment 1.
Figure 3:
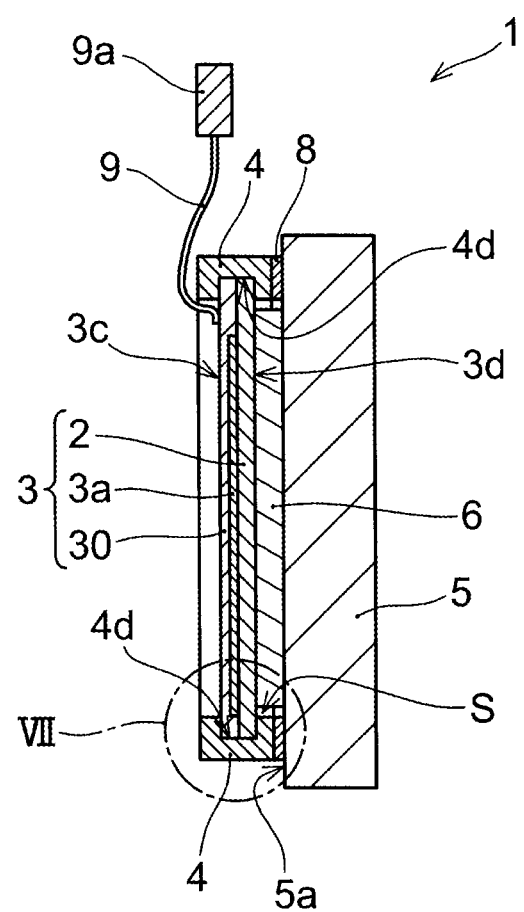
FIG. 3 shows a cross-sectional view along a line of FIG. 2.

In FIG. 2, there is shown a plan view of a display apparatus 1 which is an example of a display apparatus manufactured by the method for manufacturing display apparatus according to Embodiment 1, and in FIG. 3, there is shown a cross-sectional view along a line shown in FIG. 2. For clear understanding of the method for manufacturing display apparatus according to the present embodiment, the display apparatus 1 will be described first. As shown in FIG. 2 and FIG. 3, the display apparatus 1 includes: a substrate 2 having flexibility; a display panel 3 having a plurality of display elements (pixels) 3a which are arranged in a matrix form on the substrate 2; a supporting member 5 having a surface 5a on which the substrate 2 of the display panel 3 has been placed; and a holding member 4, provided along an outer edge (indicated by the dashed line 3b in FIG. 2) of the display panel 3 so as to rim the display panel 3, to hold the display panel 3 on the surface 5a of the supporting member 5. The holding member 4 is provided at a part of or an entire of the outer edge of the display panel 3. In the example of FIG. 2, the holding member 4 is provided at the entire of the outer edge of the display panel 3. In other words, the holding member 4 is provided over the entire outer periphery of the display panel 3 along the outer edge of the display panel 3, and thus the holding member 4 has a frame-like shape as a whole. Inside the holding member 4 having the frame-like shape, the plurality of display elements 3a of the display panel 3 are exposed. Desired image is displayed inside the holding member 4. The holding member 4 engages with an outer periphery of the display panel 3, and is bonded to the surface 5a of the supporting member 5. And the substrate 2 of the display panel 3 closely contacts with the surface 5a of the supporting member 5 at a lower strength than a bonding strength between the holding member 4 and the surface 5a of the supporting member 5.

The display apparatus 1 of FIG. 2 and FIG. 3 includes a weak adhesive layer 6 composed of an adhesive agent between the substrate 2 of the display panel 3 and the supporting member 5, and the substrate 2 closely contacts with the surface 5a of the supporting member 5 via the weak adhesive layer 6. With the interposition of the weak adhesive layer 6 between the substrate 2 and the surface 5a of the supporting member 5, the display panel 3 and the supporting member 5 are securely brought into close contact with each other. Therefore, lifting of the display panel 3 while the display apparatus 1 is used or air bubble entrapment at an interface between the display panel 3 and the supporting member 5 is prevented. However, the weak adhesive layer 6 may be not necessarily formed as with an example described below. Reference numeral 30 indicates a sealing film that protects the display elements 3a. A part of or the whole of the sealing film 30 may be a second barrier layer 38 described below (refer to FIG. 4).

The term "weak adhesive" as used herein refers to the adhesion to an extent enough to adhere to an adhesion object tightly and yet to be released easily from the adhesion object when subjected to a force in a releasing direction without causing any damage to the adhesion object or leaving any glue on the adhesion surface.

An adhesion strength between the weak adhesive layer 6 and either one of or both of the substrate 2 and the supporting member 5 is, for example, 0.02 N/10 mm or more and 5.0 N/10 mm or less, and is preferably 1.5 N/10 mm or more and 2.0 N/10 mm or less. If the adhesion strength of this range is obtained, it is considered that the possibility that the display panel 3 is separated from the supporting member 5 while using the display apparatus 1 is low. In addition, it is considered that when separating the display panel 3 intentionally from the supporting member 5, the display panel 3 and the supporting member 5 can be easily separated from each other merely by pulling the display panel 3 and the supporting member 5 with an appropriate force or merely by inserting a thin plate into the interface and letting air in.

In the examples of FIG. 2 and FIG. 3, the display panel 3 has a rectangular shape at a surface on which an image is to be displayed (the surface drawn at the front side in FIG. 1). The display panel 3 abuts on the holding member 4 in such a manner that the sides, top surface 3c (the opposite surface to the surface facing the supporting member 5), and bottom surface 3d (the surface facing the supporting member 5) of all of the two longer edges and two shorter edges of the rectangular shape abut on the holding member 4. And, the holding member 4 is bonded to the supporting member 5. In the display apparatus 1, the holding member 4 is bonded to the supporting member 5 by using an adhesive 8 with a bonding strength that does not allow facile separation. Thus, the movements of the display panel 3 is restricted by the holding member 4 in any directions along the surface 5a of the supporting member 5 as well as in a direction to which the panel is separated from the surface 5a, therefore, the display panel 3 is fixed at a predetermined position on the surface 5a of the supporting member 5. In FIG. 3 (and FIG. 9B and FIG. 10 described below), the constituent elements are drawn to be appropriately exaggerated in the thickness direction of the display panel 3 for the sake of clarity. Therefore, with respect to the thickness, the constituent elements are not necessarily drawn at exact ratios in relation to the other constituent elements.

On the other hand, the display panel 3 per se is not rigidly bonded to the supporting member 5, and is merely in close contact with the supporting member 5 because the substrate 2 closely contacts with the surface 5a of the supporting member 5. As described above, the substrate 2 closely contacts with the surface 5a of the supporting member 5 at the lower strength than the bonding strength between the holding member 4 and the surface 5a of the supporting member 5. Therefore, by appropriately selecting the adhesion strength between the substrate 2 and the supporting member 5 and the bonding strength between the holding member 4 and the supporting member 5, the display panel 3 can be easily detached from the supporting member 5 as required while the display panel 3 is held on the supporting member 5 in normal use. For example, in a case where the holding member 4 is an elastic body formed using a silicone resin or the like, the display panel 3 can be detached from the supporting member 5 merely by deforming the holding member 4 and then detaching the display panel 3 from the holding member 4. Even if the holding member 4 cannot be easily deformed, the display panel 3 can be detached from the supporting member 5 without causing severe damage to the display panel 3 or the supporting member 5 by plastically deforming or breaking the holding member 4 which can be prepared at comparatively low cost. If a defect occurs on either one of the supporting member 5 and the display panel 3, an unbroken supporting member 5 or display panel 3 can be reused.

The term "close contact" between the display panel 3 and the supporting member 5 as used herein refers to a state in which the display panel 3 and the supporting member 5 are in tight contact without any space that triggers a separation while receiving certain action which maintains the contact between the display panel 3 and the supporting member 5. Also, the term "close contact" refers a state of the contact which enables the display panel 3 and the supporting member 5 to be separated from each other merely by applying a force in the separating direction without requiring any chemical action for the separation, leaving no remains of the display panel 3 or the supporting member 5 on their separating surface after the separation. Examples of an action of maintaining the state of the contact between the two include, for example, an adhesive action exerted by the weak adhesive layer 6. In a case where the weak adhesive layer 6 is not be provided, the action of maintaining the contact between the display panel 3 and the supporting member 5 may be provided by: a force to press the display panel 3 towards the supporting member 5, which can be applied by the bonding of the holding member 4 to the supporting member 5; an electrostatic force due to a slight electrification of the two; a decompression adsorbing action that can be caused by the two being temporary in contact with each other or close to each other; or the Vander Waals force; or the like. However, the action which brings about the "close contact" between the display panel 3 and the supporting member 5 is not limited to the action mentioned above.

In the display apparatus 1, the display panel 3 is not bonded to the supporting member 5 but closely contacts with the supporting member 5 as mentioned above. Therefore, a partial separation between the display panel 3 and the supporting member 5 can be prevented. For example, in a case where the display panel 3 is a transparent organic EL display panel formed using a light transmissive material or is a transparent liquid crystal display panel, if there is a separating part between the display panel 3 and the supporting member 5, unevenness may occur in an image recognized by human eyes. However, according to the method for manufacturing of the present embodiment, the display panel 3 and the supporting member 5 closely contact with each other and thus such unevenness can be reduced.

In the examples of FIG. 2 and FIG. 3, an outer edge part of the display panel 3 is inserted into a groove 4d provided on an interior wall of the frame-like holding member 4 over the entire outer periphery of the display panel 3. In other words, the groove 4d is provided all over the interior wall of the holding member 4 having the frame like shape as a whole. The holding member 4 has a U-shaped cross-sectional shape at all edges of the frame-like shape. The holding member 4 is bonded to the supporting member 5 by the adhesive 8 at the entire of the frame-like shape.

The display apparatus 1 is provided with a wiring 9. The wiring 9 is provided to connect the display panel 3 and a driver (not shown) that supplies a drive signal to the display panel 3. The wiring 9 is attached to the display panel 3 at one end of the wiring 9. The one end of the wiring 9 is connected to a contact pad (not shown) provided on a top surface 3c of the display panel 3 by using, for example, an anisotropic conductive film (ACF), the top surface being exposed to the inside of the frame-like holding member 4. In the example shown in FIG. 2, the wiring 9 is connected to a part that lies along one of the two longer edges of the display panel 3. As shown in FIG. 3, in a case where the wiring 9 is drawn out toward the direction to which a side surface of the display apparatus 1 faces, the wiring is drawn out through an upper side of one edge of the frame-like holding member 4 (the region in the opposite direction to the direction toward the supporting member 5). Unlike the example shown in FIG. 2, the wiring 9 may be connected to the display panel 3 at a part along one of the two shorter edges of the display panel 3.

Examples of the wiring 9 include a flexible printed circuit (FPC) having a flexible film formed of a resin such as polyimide or polyethylene terephthalate and a wiring pattern formed on the flexible film using a conductor such as copper. However, the wiring 9 is not limited to the FPC, and any wiring member can be used for the wiring 9. In FIG. 2 and FIG. 3 (and in FIGS. 9A, 9B and 10 described below), there is shown the wiring 9 which is in a state that it is inserted to a connector 9a at the end part opposite to an end connected to the display panel 3 and thereby engaging with the connector 9a. The wiring 9 can be connected via the connector 9a as described, and therefore, when the display panel 3 is detached from the supporting member 5, for example, the driver (not shown) and the display panel 3 can be easily separated from each other. In addition, the wiring 9 may be provided with a connector at the one end to be connected to the display panel 3, and the display panel 3 and the wiring 9 may be connected to each other by way of connector engagement. In that case, when the display panel 3 is damaged, the wiring 9 can be reused for another display panel.

Figure 4:
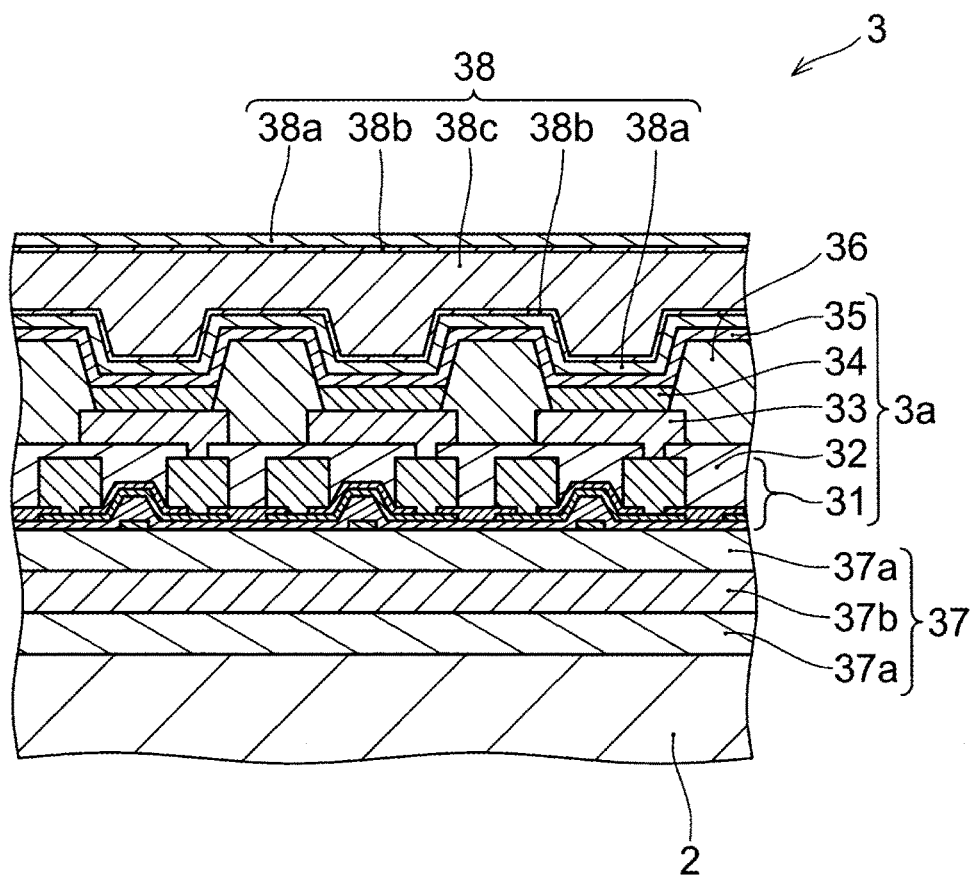
FIG. 4 shows an example of internal structure of a display panel and an example of a barrier layer of a display apparatus manufactured by the method for manufacturing display apparatus according to Embodiment 1.

Returning to the description of the method for manufacturing display apparatus according to the present embodiment, formation of the display panel 3 will be described first. Examples of the display panel 3 include an organic EL display panel and a liquid crystal display panel. However, the display panel 3 is not limited to those panels. In FIG. 4, an example of the structure of the organic EL display panel used as the display panel 3 is shown in an enlarged manner. As shown in FIG. 4, the display panel 3 includes the substrate 2 and the plurality of display elements 3a formed on the substrate 2. The substrate 2 is a resin film formed using, for example, a polyimide resin. In a case where the display panel 3 is the transparent organic EL display panel, a transparent polyimide resin for example is used as a material for the substrate 2. In a case where an organic EL display panel is formed as the display panel 3, organic EL display elements (display elements 3a) including a TFT 31 and an organic layer 34 are formed on the flexible substrate 2 formed by a slot die coating technique or the like using a polyimide resin or the like.

At this step, preferably, a first barrier layer 37 is formed by depositing at least two layers, between the substrate 2 and the display elements 3a (specifically, TFT 31), each formed using a moisture impermeable material. Examples of the moisture impermeable material include silicon nitride and silicon oxide. In the example of FIG. 4, the first barrier layer 37 is formed by forming three-layered layer (silicon oxide layer 37b and silicon nitride layers 37a each formed at upper and lower sides of the silicon oxide layer 37b) on the substrate 2. The silicon nitride layer 37a and the silicon oxide layer 37b are formed by the Plasma-Enhanced Chemical Vapor Deposition (PECVD) or sputtering for example.

Then, a plurality of organic EL display elements (the display elements 3a) are formed on the first barrier layer 37. Each display element 3a has: a TFT (Thin Film Transistor) 31; a first electrode 33 connected to the TFT 31; an organic layer 34 to emit light formed of an organic material vapor-deposited on the first electrode 33; and a second electrode 35 formed on the organic layer 34. Each display element 3a is separated by a bank 36 formed using $SiO_2$ or the like. The first electrode 33 and the bank 36 are formed on a flattening layer 32 that covers the TFT 31.

The TFT 31 is formed using a polycrystalline silicone for example, and is preferably formed of a transparent amorphous oxide semiconductor such as an oxide of indium, gallium, and zinc. In addition, the TFT 31 may be formed using an organic semiconductor material such as pentacene, copper phthalocyanine, fluorinated phthalocyanine. The first electrode 33 is formed of a conductive material having a light transmission property such as an ITO layer. Although the organic layer 34 is shown as a single layer in FIG. 4, this layer can be actually formed to have a multilayered structure including a hole transport layer, a light emitting layer, an electron transport layer or the like. The hole transport layer is formed of an amine-based material for example; the light emitting layer is formed, for example, using a material prepared by doping the host material such as $Alq_3$, BAlq with a dopant according to a light color; and the electron transport layer is formed of, for example, $Alq_3$ or the like. The organic layer 34 may further include a hole injection layer and an electron injection layer which are not shown. The second electrode 35, in order to effectively perform electron injection, is formed of a metal with a small work function such as an Mg—Ag alloy layer or aluminum or an alkaline metal or an alkaline earth metal, and is preferably formed so as to have transparency by forming these materials to be sufficiently thinner than a light wavelength. The cross-sectional structure shown in FIG. 4 is provided as a mere example, and the structure of the organic EL display panel constituting the display panel 3 and materials for the constituent elements are not limited to the structure or materials described herein. The TFT 31, the first and second electrodes 33, 35 and the organic layer 34 which constitute the organic EL display elements can be formed by any method including a well-known method, and a detailed description thereof is omitted.

After formation of the display elements 3a, preferably, a second barrier layer 38 is formed by depositing at least two layers on the display elements 3a, each formed using a moisture impermeable material. Examples of the moisture impermeable material include silicon nitride, silicon oxide, and silicon nitride oxide. In the example of FIG. 4, on the display elements 3a, a silicon nitride layer 38a, a silicone oxide layer 38b, and further, an organic layer 38c are formed sequentially, and onto that, a silicon oxide layer 38b and a silicon nitride layer 38a are formed again. The organic layer 38c is formed, for example, by printing an epoxy resin or an acrylic resin by using an inkjet printer. The silicon nitride layers 37a and the silicon oxide layers 37b are formed by, for example, the PECVD or sputtering. In a case where the second barrier layer 38 is formed, for example, only the silicon nitride layer 38a and the organic layer 38c may be formed. Thus, in the method for manufacturing display apparatus according to the present embodiment, the barrier layers (the first barrier layer 37 and the second barrier layer 38) are formed preferably at either one of or both of a position between the substrate 2 and the display elements 3a and a position on the display elements 3a.

A water vapor transmission rate of the first barrier layer 37 and the second barrier layer 38 is $10^{-4}$ g/m²/day or less, for example. The first and second barrier layers 37, 38 are provided as described, resulting that the organic layer 34 which is prone to deteriorate due to a contact with moisture is protected and such permeation of moisture passing through the inside of the display panel 3 to an interface between the display panel 3 and the supporting member 5 is strictly prevented. Although the display panel 3 and the supporting member 5 (refer to FIG. 3) can closely contact with each other directly or via the weak adhesive layer 6 in the display apparatus 1, if moisture or air bubbles enter the interface between the elements, an adhesion strength on the interface may lower. In particular, in a case where the weak adhesive layer 6 is not provided as in examples described below, the adhesion strength may lower due to entry of a small amount of moisture or air bubbles. However, the entry of moisture to the interface between the display panel 3 and the supporting member 5 is prevented by providing the first barrier layer 37 and the second barrier layer 38. Thus, it is considered that the adhesion strength between the display panel 3 and the supporting member 5 which have been once brought into a state of close contact with each other is easily maintained.

In the example of FIG. 4, the silicon oxide layer 37b of the first barrier layer 37 is put between the two silicon nitride layers 37a. Silicon nitride is excellent in barrier performance relative to moisture, and silicon oxide has more flexibility than silicon nitride. Therefore, by forming the first barrier layer 37 so as to be the multilayered layer including the silicon nitride layer 37a and the silicon oxide layer 37b, a barrier layer having a high barrier performance, in which a crack or the like hardly occurs, can be obtained. In addition, a pinhole that can be generated at any position in each layer is closed by another layer and thus a higher barrier performance is obtained. However, the first barrier layer 37 may be a single-layer. The first barrier layer 37 may also be a multilayered layer including a plurality of layers other than three layers as composed of a pair of silicon nitride layer 37a and silicon oxide layer 37b. In addition, the first barrier layer 37 may be formed using a material other than silicon nitride and silicon oxide.

The organic layer 38c of the second barrier layer 38 is formed using, for example, an epoxy resin or an acrylic resin, and is put between two silicon oxide layers 38b. In addition, the silicon nitride layer 38a is formed further outside of each of the two silicon oxide layers 38b, respectively. The cross-sectional shapes of the silicon nitride layer 38a right above the second electrode 35 and the silicon oxide layer 38b right above the silicon nitride layer have irregularities due to a difference in height between the bank 36 and the organic layer 34. Such irregularities or undesired particles (not shown) adhering to a surface of the display element 3a, or the like, can be embedded in the organic layer 38c that can be flexible. Consequently, on the organic layer 38c, the silicon nitride layer 38a or the like can be stably formed. Also, by interposing the silicon oxide layer 38b, the adhesion strength between the silicon nitride layer 38a and the organic layer 38c can be improved. However, the silicon oxide layer 38b is not necessarily required, and only the silicon nitride layer 38a and the organic layer 38c may be formed. In addition, the organic layer 38c or the silicon oxide layer 38b may not be provided. Further, in place of the silicon nitride layer 38a, a silicon nitride oxide layer that can be formed more quickly than the silicon nitride layer 38a may be provided. The second barrier layer 38 may be a single-layer or may be a multilayered layer including a plurality of layers other than the above-mentioned five layers. Furthermore, the second barrier layer 38 may be formed using an inorganic material other than silicon nitride and silicon oxide (such as silicon nitride oxide or alumina, for example) or an organic material other than an epoxy resin or an acryl resin (such as a silicone resin or a urethane resin for example).

A thickness of the first barrier layer 37 and a thickness of the second barrier layer 38 in a case where the organic layer 38c is not included are, for example, 500 nm or more, preferably 1 micrometer or more and 3 micrometers or less. If the first barrier layer 37 and the second barrier layer 38 have such thickness, a sufficient barrier performance relative to moisture is obtained, and it is considered that a crack hardly occurs with each barrier layer and further the light transmittance is less influenced. The thickness of the silicon nitride layers 37a, 38a is 500 nm or more and 1.5 micrometers or less, for example, and a thickness of the organic layer 38c is of the order of 10 micrometers, for example. A thickness of the silicon oxide layer 38b between the organic layer 38c and the silicon nitride layer 38a is 10 nm or more and 30 nm or less for example.

It can be appreciated that in a case where the display panel 3 is the liquid crystal display panel (not shown), the display panel 3 includes: a first substrate having flexibility, which is formed using a very thin glass plate or the like; a second substrate having flexibility, which is disposed to be spaced from the first substrate; and a liquid crystal layer between the first and second substrates. For example, the display panel 3 is provided with: a TFT formed on the first substrate; a pixel electrode connected to the TFT; and a first alignment film formed on the pixel electrode. Further, each liquid crystal display element is provided with a color filter, a common electrode, and a second alignment film, all of which are provided in order on a surface facing the first substrate in the second substrate disposed to be spaced from the first substrate. The liquid crystal layer is composed of a liquid crystal material filled between the first and second alignment films. Further, on each of the respective surfaces of the first substrate and the second substrate, which are opposite to a surface facing the liquid crystal layer, a polarization film is provided. Such liquid crystal display panel is placed on the supporting member 5 so that the first substrate and the supporting member 5 (refer to FIG. 3) face one another. The structure of the liquid crystal display panel that can constitute the display panel 3 in the display apparatus 1 of the present embodiment is not limited to the structure described herein. Any liquid crystal display panel having a flexible substrate and preferably composed of a light transmissive material can be used as the display panel 3 in the method for manufacturing display apparatus according to the present embodiment. In addition, a light guiding sheet having flexibility and including an edge light may be provided, as a backlight unit, on a surface of the first substrate facing the supporting member 5. In a case where a liquid crystal display panel is formed as the display panel 3, each electrode, alignment films, polarization films, and liquid crystal layer which constitute the liquid crystal display elements can be formed by any method including a well-known method. Therefore, a detailed description thereof is omitted.

Explanation of the method for manufacturing display apparatus according to the present embodiment will be continued with referring to FIG. 1 to FIG. 3 again. Preferably, prior to providing the holding member 4 at the outer edge of the display panel 3, the wiring 9 composed of, for example, FPC is prepared, and the wiring 9 is connected to the display panel 3. Specifically, one end of the wiring 9 and a contact pad 3e which is provided on the display panel 3 using a conductive material are electrically and mechanically connected to each other. For example, the wiring 9 and the display panel 3 are connected to each other by pressurizing and heating them while an anisotropic conductive film (ACF) is interposed between the wiring 9 and the display panel 3. Before the holding member 4 is provided on the display panel 3, the wiring 9 and the display panel 3 can be easily pressurized and heated regardless of heat resistance of the holding member 4.

Figure 5A:
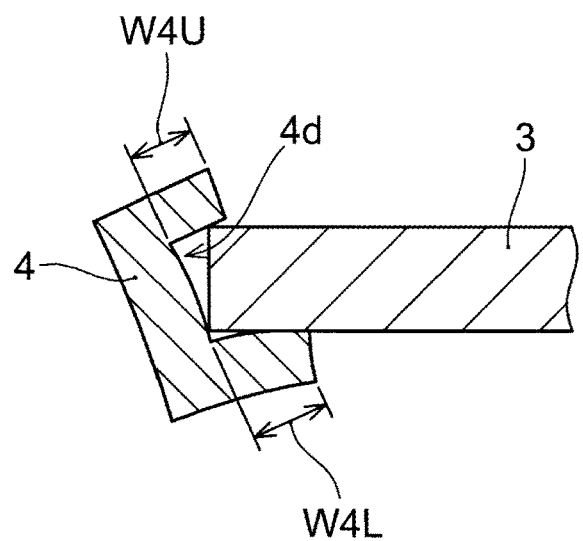
FIG. 5A shows an example of a way of engaging a display panel and a holding member in the method for manufacturing display apparatus according to Embodiment 1.

Thus, preferably, after the wiring 9 has been connected to the display panel 3, the holding member 4 engaging with the outer periphery of the display panel 3 is provided at the outer edge of the display panel 3. The holding member 4 is preferably provided in the frame-like shape at the entire of the outer edge of the display panel 3. For example, as shown in FIG. 1, a frame-shaped body which is to be the holding member 4 and has a groove 4*d* on the interior wall is prepared. Then, the outer edge part of the display panel 3 is inserted into the groove 4*d* before the substrate 2 is placed on the surface 5*a* of the supporting member 5. The frame-shaped body to be the holding member 4 is preferably formed so as to have elasticity and flexibility. Preferably, the holding member 4 is engaged with the display panel 3 from a position facing a surface of the display panel 3 opposite to a surface to which the wiring 9 is connected. Even if the wiring 9 has been already connected to the display panel 3, the outer edge part of the display panel 3 can be inserted into the groove 4*d*. In a case where the holding member 4 has elasticity or flexibility, as shown in FIG. 5A, when the outer edge part of the display panel 3 is inserted into the groove 4*d*, the outer edge part of the display panel 3 can be easily inserted into the groove 4*d* by deforming the holding member 4. Removal can also be easily made. Moreover, as shown in FIG. 5A, a frame-shaped body (the holding member 4) can be prepared, in which at each edge of the frame-like holding member 4, lengths W4U, W4L of each of a pair of contact parts constituting two opposite interior walls of the groove 4*d* and extending to the inside of the frame-like holding member 4 are different from each other. In that case, when the outer edge part of the display panel 3 is inserted into the groove 4*d*, the shorter contact part is fit to the display panel 3 after fitting the longer contact part as shown in FIG. 5A, thereby, the outer edge part of the display panel 3 can be more easily inserted into the groove 4*d*.

The holding member 4 may not be provided necessarily at the entire of the outer periphery of the display panel 3. For example, in a case where the display panel 3 has a rectangular or square shape, the holding member 4 may be provided only at two of opposing edges or any edges or may be provided at any three edges or only one edge.

The holding member 4 is formed of any material that can hold the display panel 3. Examples of the materials for the holding member 4 include, for example, a synthetic resin such as an epoxy resin or a general purpose plastics, a natural resin such as a natural rubber, and a rubber sponge. The frame-shaped body to be the holding member 4 can be prepared by, for example, molding processing of a synthetic resin or a natural resin. The holding member 4 is preferably formed using a light transmissive material. This is because it makes the holding member 4 inconspicuous, and in particular, in a case where the supporting member 5 is formed of a light transmissive material (such as a glass, transparent polyimide, PET, PEN, for example) and the display panel 3 is the transparent organic EL display panel, it hardly produces an opaque portion due to the holding member 4 in the display apparatus 1. In view of these points of view, it is particularly preferable that the holding member 4 is formed using a transparent silicone rubber.

Next, the supporting member 5 having the surface 5*a* on which the substrate 2 of the display panel 3 is to be placed is prepared, and the substrate 2 is placed on the surface 5*a* of the supporting member 5. The holding member 4 can be placed on the surface 5*a* of the supporting member 5 together with the substrate 2, and the holding member 4 is bonded to the surface 5*a* of the supporting member 5. Then, preferably together with the bonding, the substrate 2 of the display panel 3 is brought into close contact with the surface 5*a* of the supporting member 5. The substrate 2 is brought into close contact with the surface 5*a* at a strength lower than the bonding strength between the holding member 4 and the surface 5*a* of the supporting member 5.

The holding member 4 is bonded to the supporting member 5 using the adhesive 8, for example. The holding member 4 is pressed against the supporting member 5 as required. In addition, whenever necessary, heating processing is performed for curing of the adhesive 8. The adhesive 8 may be applied to either one of or both of a bonding surface of the holding member 4 and the surface 5*a* of the supporting member 5, or as shown in FIG. 1, the adhesive 8 may be placed between the holding member 4 and the supporting member 5 after being molded into a form of frame-like sheet.

The supporting member 5 is not particularly limited as to the shape or material as long as it is possible to appropriately support the display panel 3 that can have flexibility. For example, any material such as a glass, a metal or a synthetic resin can be used for the supporting member 5. The supporting member 5 can be prepared by processing these materials in any manner; alternatively, the existing article may be prepared as the supporting member 5. In other words, the supporting member 5 may also be any member constituting other a variety of apparatuses, devices, tools or structures, or part thereof. For example, the supporting member 5 may be a glass plate used in a household window, a show window, an exhibition casing or the like, or alternatively, supporting member 5 may be a casing of a variety of devices or a member constituting the interior wall or exterior wall of building. In addition, the supporting member 5, as described below, may be a vehicle windshield.

The adhesive 8 used in bonding the holding member 4 to the supporting member 5 is not particularly limited as long as it is possible to develop the bonding strength capable of stably bonding the holding member 4 to the supporting member 5. An arbitrary epoxy adhesive or acrylic adhesive can be used as the adhesive 8. The holding member 4 is preferably bonded to the surface 5*a* of the supporting member 5 using the light transmissive adhesive 8. As described above, in a case where the holding member 4 is formed using the light transmissive material, it is particularly preferable to use the light transmissive adhesive 8. For example, any adhesive which is called Optical Clear Adhesive (OCA) or Optical Clear Resin (OCR) such as a film-like or paste-like acrylic-based, silicone-based or urethane-based adhesive can be used as the adhesive 8. The bonding strength between the holding member 4 and the supporting member 5 that is obtained by the adhesive 8 is larger than 5.0 N/10 mm and is 10 N/10 mm or less, for example.

In the example shown in FIG. 1, the substrate 2 of the display panel 3 is brought into close contact with the surface 5*a* of the supporting member 5 via the weak adhesive layer 6. The weak adhesive layer 6 can be formed by disposing a weak adhesive sheet, formed using an adhesive agent, on the surface 5*a* of the supporting member 5 or the surface of the substrate 2 opposite to the surface facing the display elements 3*a*. The adhesive agent constituting the weak adhesive layer 6 can include acrylic-based, silicone-based or urethane-based resin solely or in combination of a plurality thereof as main component. The acrylic resin has a superior weather resistance and heat resistance and further has a superior transparency. In a case where the display panel 3 is the transparent organic EL display panel or the transparent liquid crystal display panel and the supporting member 5 is the glass plate or the like, the weak adhesive layer 6 having a high transparency is preferred in that light transmission property of the display apparatus 1 is less influenced. A silicone-based resin also has a superior weather resistance and transparency and further has a particularly superior heat resistance and hardly turns to yellow and thus is preferred as a material for the weak adhesive layer 6. By forming the weak adhesive layer 6, the substrate 2 is brought into close contact with the surface 5*a* of the supporting member 5 via the weak adhesive layer 6 at a strength lower than a bonding strength between the holding member 4 and the surface 5*a* of the supporting member 5.

Figure 5B:
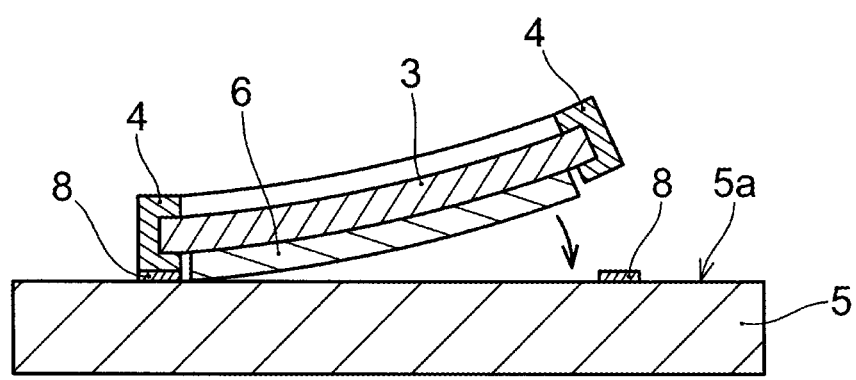
FIG. 5B shows an example of a step of bringing a display panel into close contact with a supporting member in the method for manufacturing display apparatus according to Embodiment 1.

It is preferable that the substrate 2 of the display panel 3 is brought into close contact with the supporting member 5 without entrapping, for example, air bubbles. Therefore, the display panel 3 is subsequently placed on the surface 5*a* of the supporting member 5 from the one end while being bended as shown in FIG. 5B. At this step, as shown in FIG. 5B, the holding member 4 also needs to be bended. It is preferable to form the holding member 4 to be flexible so that the display panel 3 can be placed on the supporting member 5 by a method which hardly entraps air bubbles. The display apparatus 1 will be completed by, for example, carrying out the above-mentioned steps.

Figure 6:
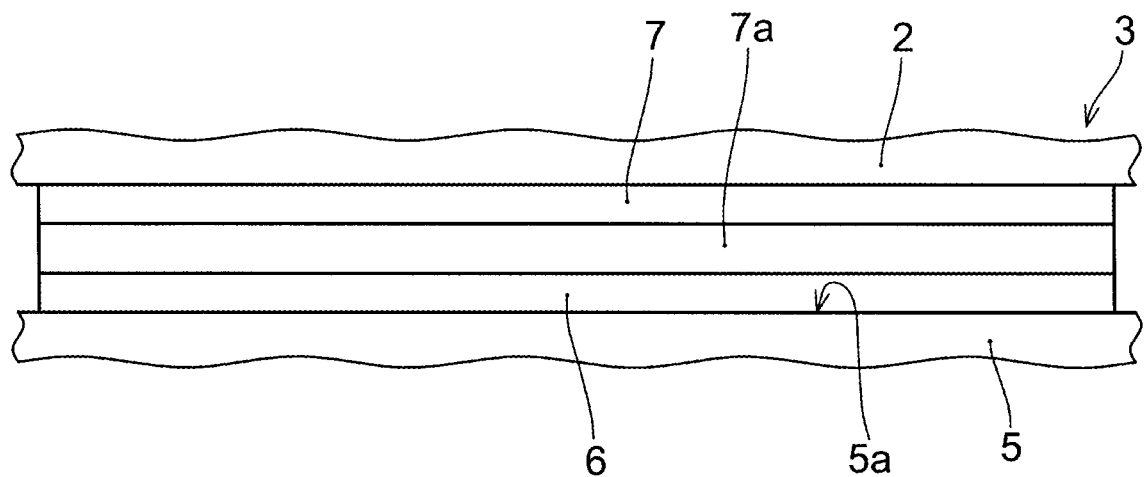
FIG. 6 shows an example of a weak adhesive layer and an example of a strong adhesive layer in the method for manufacturing display apparatus according to Embodiment 1.

The method for manufacturing display apparatus according to the present embodiment may further comprise providing a strong adhesive layer having an adhesive force equal to or more than an adhesive force of the weak adhesive layer 6 between the weak adhesive layer 6 and the substrate 2 or between the weak adhesive layer 6 and the supporting member 5, when the substrate 2 is placed on the surface 5*a* of the supporting member 5. In FIG. 6, an example of an interface part provided between the substrate 2 and the supporting member 5 of the display apparatus 1, which is provided with a strong adhesive layer 7 is shown in an enlarged manner. In the example of FIG. 6, in addition to the weak adhesive layer 6, the strong adhesive layer 7 is provided between the substrate 2 and the supporting member 5. The strong adhesive layer 7 is provided between the weak adhesive layer 6 and the substrate 2, and closely contacts with the substrate 2. Meanwhile, the weak adhesive layer 6 is provided between the strong adhesive layer 7 and the supporting member 5, and closely contacts with the supporting member 5. The display panel 3 closely contacts with the surface 5*a* of the supporting member 5 via the weak adhesive layer 6 and the strong adhesive layer 7. The strong adhesive layer 7 is bonded to the weak adhesive layer 6 via a base material 7*a*. The strong adhesive layer 7 may be directly bonded to the weak adhesive layer 6 without the base material 7*a* or the like. The strong adhesive layer 7 and the weak adhesive layer 6 are bonded to each other directly or via the base material 7*a* at a stronger strength than the adhesive force between the weak adhesive layer 6 and the supporting member 5. In the example of FIG. 6, the strong adhesive layer 7 bonded to the weak adhesive layer 6 in this manner is provided, therefore, the display panel 3 can be detached from the supporting member 5 in a state that the weak adhesive layer 6 is securely adhered to the substrate 2, namely the display panel 3.

Unlike the example of FIG. 6, the strong adhesive layer 7 may closely contact with the supporting member 5 by providing the strong adhesive layer 7 between the weak adhesive layer 6 and the supporting member 5. In addition, the weak adhesive layer 6 may closely contact with the substrate 2 by providing the weak adhesive layer 6 between the strong adhesive layer 7 and the substrate 2. In this case, the display panel 3 can be detached from the supporting member 5 in a state that the weak adhesive layer 6 is securely adhered to the supporting member 5. The strong adhesive layer 7 is preferably brought into close contact with either the display panel 3 or the supporting member 5, whichever has lower failure rate. By having the strong adhesive layer 7, it becomes clear to which the weak adhesive layer 6 remains, the display panel 3 or the supporting member 5, and thus the workability at the time of replacement of the display panel 3 may be improved.

The adhesion strength between the strong adhesive layer 7 and the substrate 2 or the surface 5*a* of the supporting member 5 is 2.5 N/10 mm or more and 20 N/10 mm or less for example, and preferably 5.0 N/10 mm or more and 20 N/10 mm or less. As in the example of FIG. 6, when the strong adhesive layer 7 closely contacts with the substrate 2, the adhesion strength between the weak adhesive layer 6 and the supporting member 5 is, for example, 0.02 N/10 mm or more and 5.0 N/10 mm or less as described above. However, the adhesion strength between the strong adhesive layer 7 and the substrate 2 is larger than the adhesion strength between the surface 5*a* of the supporting member 5 above which said substrate 2 is placed and the weak adhesive layer 6, and the adhesion strength between the strong adhesive layer 7 and the surface 5*a* of the supporting member 5 is larger than the adhesion strength between the substrate 2 placed above said supporting member 5 and the weak adhesive layer 6. As long as such relation among the adhesion strength is maintained, the display panel 3 can be detached in a state that the weak adhesive layer 6 is securely adhered to a desired element (display panel 3 or supporting member 5). The weak adhesive layer 6, for example, is provided on a first surface of the film-like base material 7*a* formed with polyethylene terephthalate or the like, and the strong adhesive layer 7 is provided on a second surface that is an opposite surface to the first surface of the base material 7*a*. In addition, the weak adhesive layer 6 and the strong adhesive layer 7 may be disposed between the display panel 3 and the supporting member 5 in a state of a double-sided adhesive sheet including the base material 7*a* and having three-layer structure.

Figure 7:
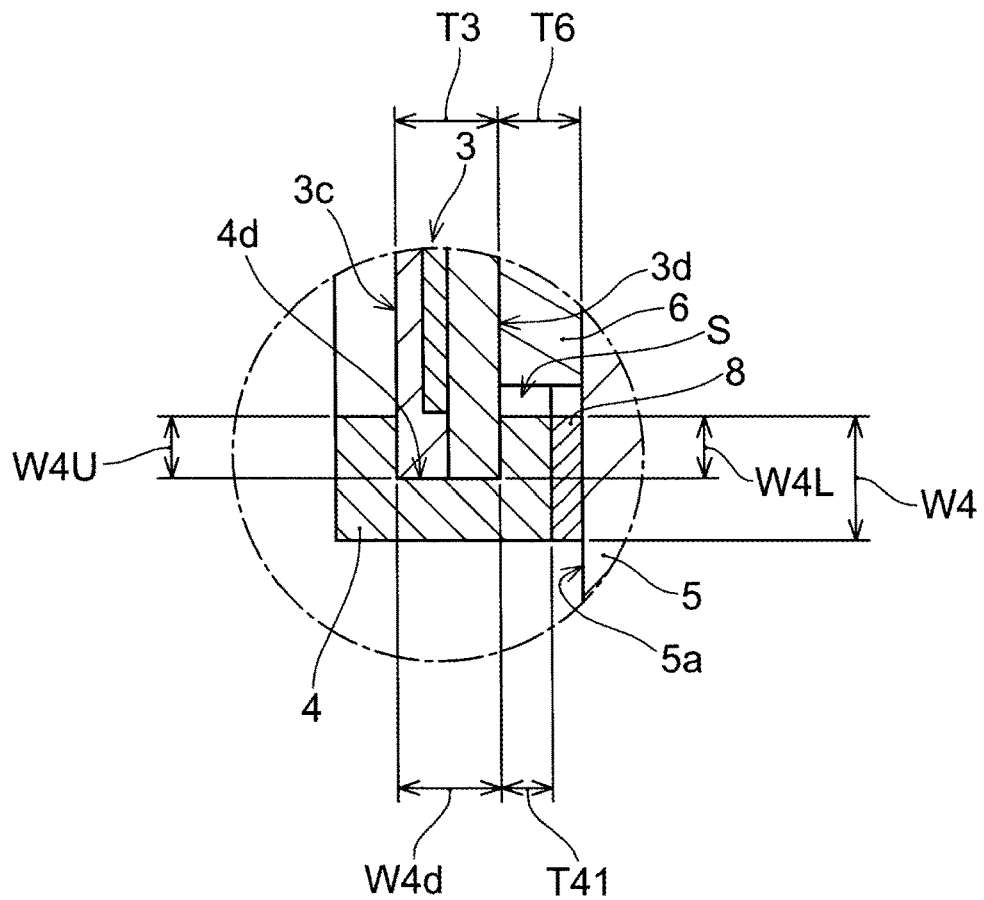
FIG. 7 shows an enlarged view of a portion VII of FIG. 3.

In FIG. 7, an enlarged view of the portion VII in FIG. 3 is shown. Dimensions of the each part of the holding member 4 are determined so that the weak adhesive layer 6 and both the display panel 3 and the supporting member 5 securely contact with each other. For example, a thickness T41 of a portion of the holding member 4 between the display panel 3 and the supporting member 5 is selected not to cause a problematic warp or the like with the display panel 3 on the basis of the thickness T6 of the weak adhesive layer 6 as well as considering a thickness of the adhesive 8 if necessary. For example, the thickness of the holding member 4 is 0.2×T6 or more and 1.0×T6 or less. In a case where the thickness T41 falls in the range of such thickness, the display panel 3 is not easily lifted from the weak adhesive layer 6 and it is considered that the display panel 3 is stably held. In addition, a width W4*d* of the groove 4*d* is 0.9×T3 or more and 1.0×T3 or less. T3 is a thickness of the display panel 3. If the width of the groove 4*d* falls in such a range, lifting of the display panel 3 from the weak adhesive layer 6 is effectively prevented and it is considered that an excessive stress is not applied to a periphery of the display panel 3.

In addition, a width W4 of each edge of the holding member 4 is 0.01×L3 or more and 0.2×L3 or less for example, and preferably 0.02×L3 or more and 0.05×L3 or less. L3 is a length (width) of the display panel 3 in the direction of the width W4 of each edge of the holding member 4. If each edge of the holding member 4 has such a width, it is considered that the holding member 4 and the display panel 3 are securely held on the surface 5*a* of the supporting member 5 by adhesive force of the adhesive 8 and the holding member 4 is inconspicuous in the user's field of vision. Further, at the each edge of the frame-like holding member 4, lengths W4U and W4L of each of a pair of contact parts constituting two opposite interior walls of the groove 4*d* and abutting on the display panel 3 are, for example, 3.0×T3 or more and 8.0×T3 or less (in FIG. 7, it is not intended that the lengths W4U, W4L and the thickness T3 of the display panel 3 are shown at exact ratios). It is considered that the display panel 3 is securely held by the contact parts having such a length. As mentioned above, the length W4U and the length W4L may be different from each other.

In the example shown in FIG. 2 and FIG. 3, the holding member 4 has a frame-like shape which surrounds the display panel 3 at the entire of the outer edge. In addition, a space S (refer to FIG. 3 and FIG. 7) surrounded by the holding member 4, the supporting member 5 and the display panel 3 is formed between the display panel 3 and the supporting member 5, and the weak adhesive layer 6 is disposed inside the space S. The space S may be an airtight space which is produced by bringing the holding member 4 and the display panel 3 into airtight contact with each other and bonding the holding member 4 and the supporting member 5 to each other in an airtight manner. In that case, it is considered that permeation of water or air to the interface between the weak adhesive layer 6 and the display panel 3 as well as the interface between the weak adhesive layer 6 and the supporting member 5 hardly occurs, and separation on those hardly occurs.

Figure 8A:
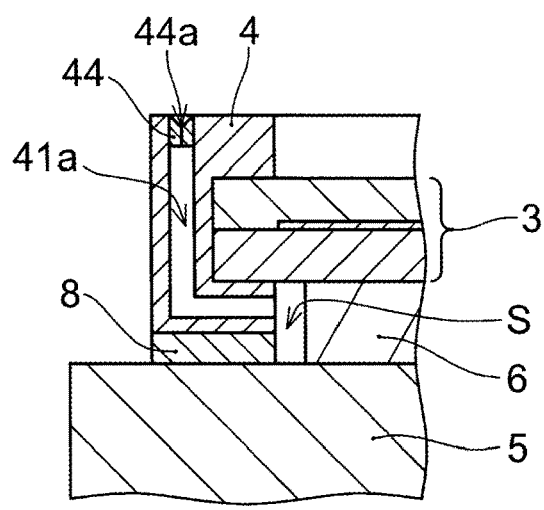
FIG. 8A shows another example of a holding member in the method for manufacturing display apparatus according to Embodiment 1.
Figure 8B:
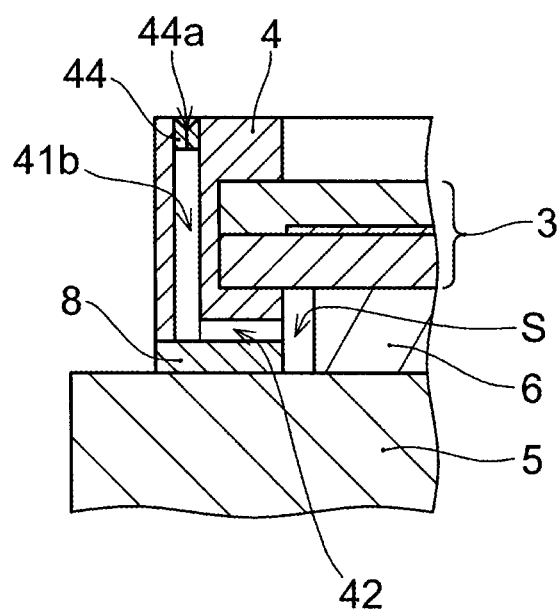
FIG. 8B shows yet another example of the holding member in the method for manufacturing display apparatus according to Embodiment 1.

Further, the air inside the space S is discharged to the outside of the display apparatus 1, and the display panel 3 and the supporting member 5 can be thereby brought into more secure close contact with each other. The holding member 4 may be provided with means for discharging such air inside the space S. In FIG. 8A and FIG. 8B, examples of the holding member 4 provided with such means are shown.

In FIG. 8A and FIG. 8B, a cross section of an arbitrary edge of the holding member 4 having a frame-like shape as a whole is shown. In an example shown in FIG. 8A, the holding member 4 has a through hole 41*a* through which the inside and the outside of the flame-like shape in the holding member 4 are communicated. The through hole 41*a* forms a suction port for discharging the air of the space S. The through hole 41*a* has openings on the upper surface of the holding member 4 and on a surface of the interior wall of the holding member 4 having the frame-like shape, and has an L-shaped cross-sectional shape. The through hole 41*a* may penetrate the holding member 4 between the surface of the interior wall and a surface of the exterior wall of the holding member 4. The holding member 4 is further provided with a closing member 44 arranged in the through hole 41*a* in the vicinity of the upper surface of the holding member 4 so as to prevent ventilation through the through hole 41*a*.

In addition, in an example shown in FIG. 8B, the holding member 4 is provided with: a through hole 41*b* having openings on the upper surface and on the lower surface of the holding member 4; and a groove 42 formed along the lower surface of the holding member 4 and connected to the through hole 41*b*. The inside and the outside of the holding member 4 are communicated through the groove 42 and the through hole 41*b*, and a suction port for discharging the air of the space S is formed by the groove 42 and the through hole 41*b*. The holding member 4 is further provided with the closing member 44 arranged in the through hole 41*b* in the vicinity of the upper surface of the holding member 4 so as to prevent ventilation through the through hole 41*b* and the groove 42.

Thus, in the method for manufacturing display apparatus according to the present embodiment, when the holding member 4 is prepared as the frame-shaped body described above, the through hole 41*a* or the through hole 41*b* and the groove 42 through which the inside and the outside of the frame-like shape of the holding member 4 are communicated may be formed at the holding member 4. In such a manner, the suction port which communicates with the inside of the frame-like shape of the holding member 4 and communicates with the outside of the frame-like shape of the holding member 4 may be formed at the holding member 4. In that case, the method for manufacturing display apparatus according to the present embodiment may comprise suctioning gas from the inside of the frame-like shape of the holding member 4 by using the suction port after bonding the holding member 4 to the surface 5*a* of the supporting member 5. By such suction, the substrate 2 may be brought into close contact with the surface 5*a* of the supporting member 5. The space S surrounded by the holding member 4 becomes a reduced pressure state or a vacuumed state, thereby, the substrate 2 can be brought into much better close contact with the supporting member 5. In addition, penetration of the air inside the space S or the moisture therein to the interface between the display panel 3 and the supporting member 5 can be prevented. The through holes 41*a*, 41*b* and the groove 42 can be formed by providing a projection part corresponding to the through holes 41*a*, 41*b* and the groove 42 in a molding die used when forming the holding member 4 or performing cutting processing with a drill or the like after forming the holding member 4. Suctioning the gas from the inside of the frame-like holding member 4 can be performed using any suctioning means, for example, suction pump. Inflow of the air into the space S after the suction can be prevented by the closing member 44.

The closing member 44 is, for example, an elastic body having a ventilation path 44*a* passing through the closing member 44, and is pressed into the through holes 41*a*, 41*b*. The closing member 44 can be formed of, for example, a natural rubber, a synthetic rubber such as a butadiene rubber or a styrene butadiene rubber or a silicone rubber. The closing member 44 is pressed into the through hole 41*a* or the through hole 41*b*, and thereby, the ventilation path 44*a* is pressed by the interior wall of the surrounding closing member 44, and is normally closed. Thus, during normal operation, the ventilation through the through holes 41*a*, 41*b* and the groove 42 is prevented by the closing member 44. When the air inside the space S is discharged, a tubular material such as a needle (not shown) is pushed against the interior wall of the surrounding closing member 44 and inserted into the ventilation path 44*a*. Then, the air inside the space S can be discharged using a pump or the like (not shown) via a tubular material such as a needle inserted into the ventilation path 44*a*.

The closing member 44 shown in FIG. 8A and FIG. 8B is merely one of examples, and the closing member 44 may have a different structure from the examples shown in these drawings. For example, the closing member 44 may be a covering material prepared so as to be attachable to and detachable from the opening of the through holes 41*a*, 41*b*. In addition, the closing member 44 may be a check valve which is disposed inside the through hole 41*a*, 41*b*, and abuts on a stepped portion provided on the interior wall of the through hole 41*a*, 41*b* when it is withdrawn by the negative pressure toward the space S in the reduced pressure state so as to close the through hole 41*a*, 41*b*.

Embodiment 2

Figure 9A:
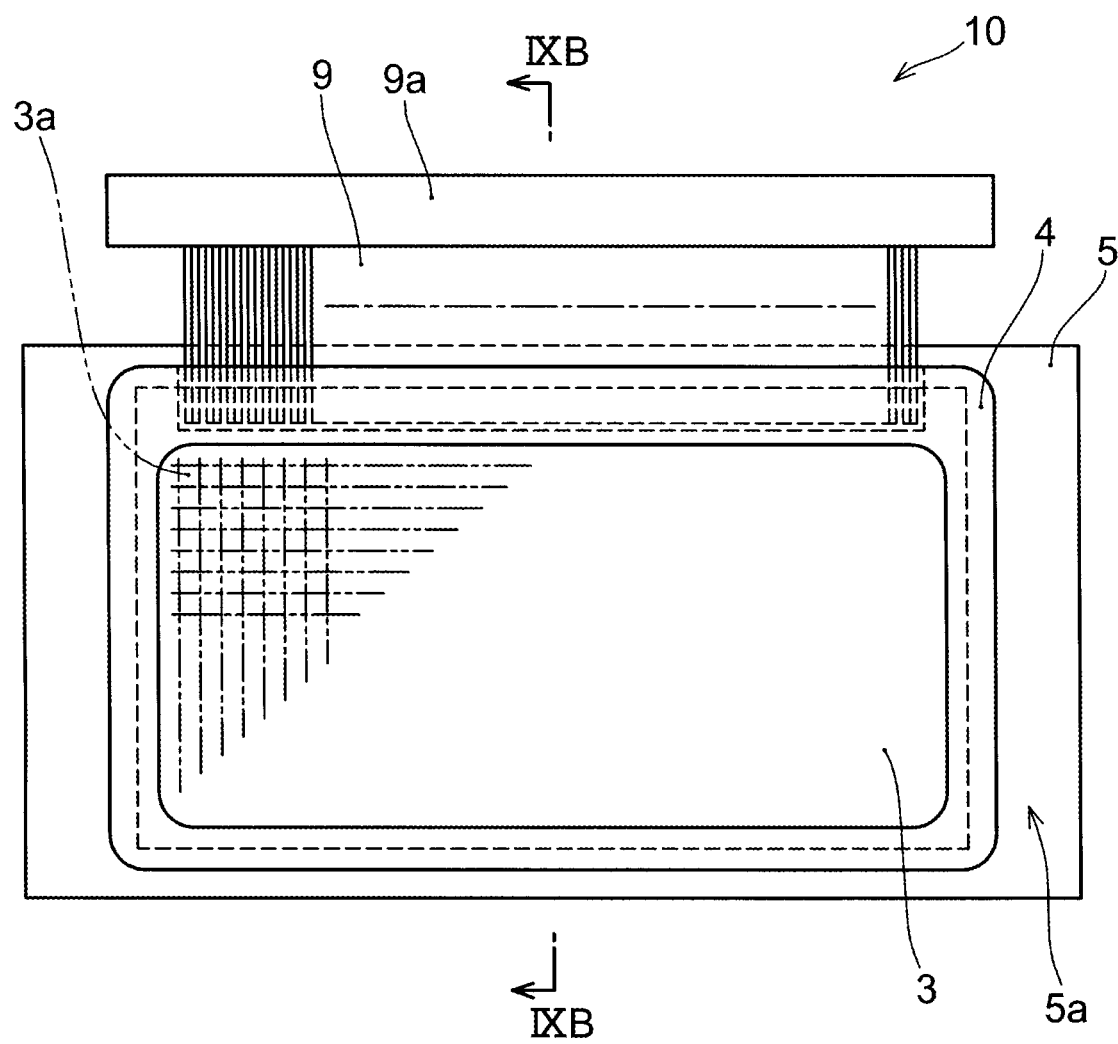
FIG. 9A shows a front view of an example of a display apparatus manufactured by a method for manufacturing display apparatus according to Embodiment 2 of the present invention.
Figure 9B:
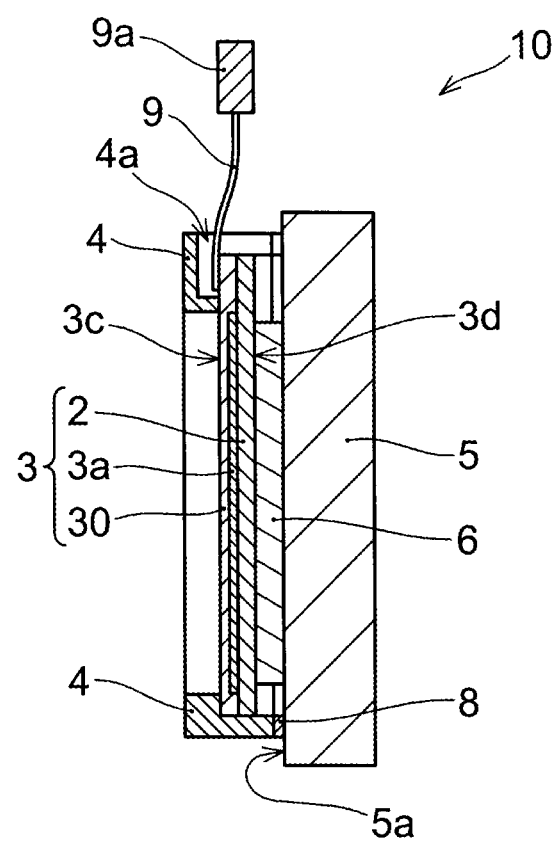
FIG. 9B shows a cross-sectional view along a line IXB-IXB of FIG. 9A.
Figure 10:
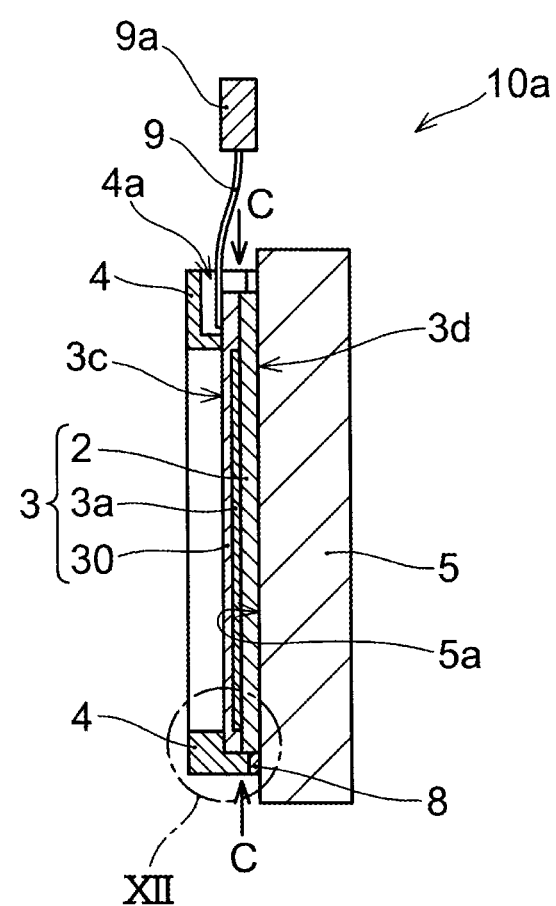
FIG. 10 shows a cross-sectional view of another example of a display apparatus manufactured by the method for manufacturing display apparatus according to Embodiment 2.

Next, a method for manufacturing display apparatus according to Embodiment 2 will be described. First, a display apparatus 10 manufactured by the method for manufacturing display apparatus according to the present embodiment will be described with referring to FIG. 9A and FIG. 9B. In FIG. 9A, FIG. 9B and FIG. 10 described below, the same constituent elements as those in FIG. 2 and FIG. 3 are referred to with the same reference numerals, and a detailed description thereof will be appropriately omitted.

In the examples of FIG. 9A and FIG. 9B, the holding member 4, at the outer periphery of the display panel 3, abuts on only the top surface 3c and side surface of the display panel 3, and does not abut on the bottom surface 3d of the display panel 3. In other words, the holding member 4 does not have the groove 4d (refer to FIG. 3). The holding member 4 having the frame-like shape as a whole has a cross-sectional shape of a substantially L-contour at each edge thereof, and abuts on the top surface 3c and side surface of the display panel 3 at two surfaces directed to the inside of the L-shape. On the other hand, the substrate 2 (bottom surface 3d of display panel 3) closely contacts with the surface 5a of the supporting member 5 via the weak adhesive layer 6, as in the example of FIG. 3 described above.

The holding member 4 includes, at a portion facing the wiring 9, a concave portion 4a provided by making a thickness of the concave portion 4a in the axial direction of the flame-like shape thinner than those of the other portions. A connection part between the wiring 9 and the display panel 3 is housed into this concave portion 4a, and the wiring 9 is drawn out from the concave portion 4a to the outside of the display apparatus 1. In other words, the connection part between the wiring 9 and the display panel 3 is covered with the holding member 4, and this connection part can be protected from an external stress by the holding member 4. In addition, the connection part between the wiring 9 and the display panel 3 is hidden inside the holding member 4, and the appearance of the display apparatus 1 may be thereby improved. The holding member 4 does not have a portion which is interposed between the supporting member 5 and the display panel 3 at each edge, so that the holding member 4 can be easily combined with the display panel 3 from above the top surface 3c of the display panel 3. Therefore, the connection part between the wiring 9 and the display panel 3 can be easily housed in the concave portion 4a. Furthermore, the connection part between the wiring 9 and the display panel 3 may be covered with a protection member composed of an epoxy resin or the like although the protection member is not shown.

In FIG. 10, a display apparatus 10a is shown, which is manufactured without forming the weak adhesive layer 6 in the method for manufacturing display apparatus according to the present embodiment. The display apparatus 10a, like the display apparatus 10 shown in FIG. 9A and FIG. 9B, comprises the holding member 4 having an L-shaped cross-sectional shape at each edge. Therefore, in an example shown in FIG. 10 as well, the holding member 4 abuts on only the top surface 3c and the side surface of the display panel 3. And the substrate 2 of the display panel 3 closely contacts with the supporting member 5 with the entire bottom surface 3d. The display panel 3 may be brought into close contact with the supporting member 5 by, for example, pressing with the holding member 4, electrostatic action, decompression adsorbing action as described above, in place of the adhesive action by the weak adhesive layer 6 (refer to FIG. 9B). In the example of FIG. 10 as well, the concave portion 4a is formed at a portion facing the wiring 9 in the holding member 4, and the connection part between the wiring 9 and the display panel 3 is housed in the concave portion 4a.

Figure 11:
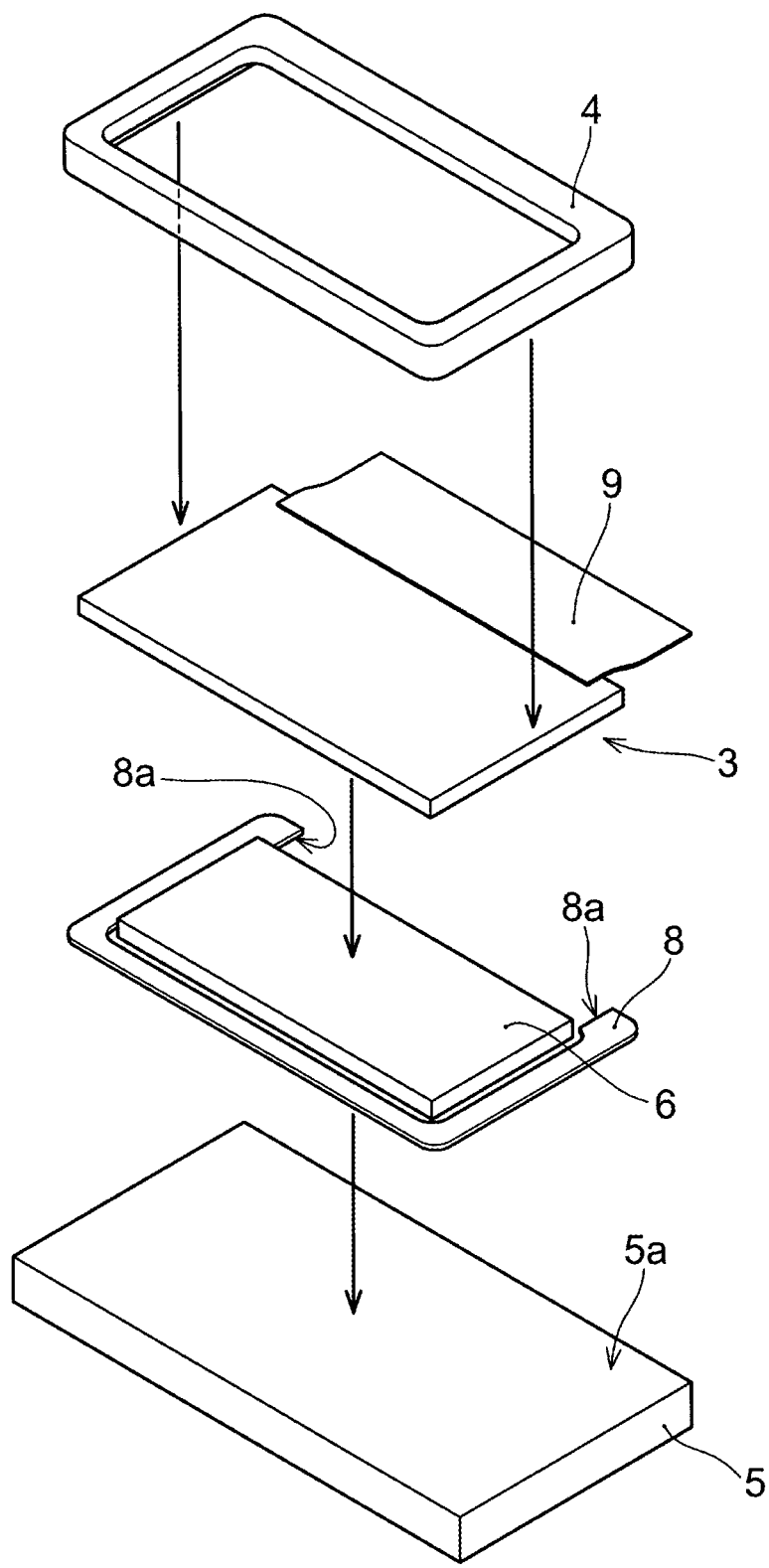
FIG. 11 shows an example of the method for manufacturing display apparatus according to Embodiment 2 of the present invention.

In FIG. 11, there is shown an exploded view of a display apparatus, which shows an example of the method for manufacturing display apparatus according to the present embodiment. In accordance with the example of the method for manufacturing shown in FIG. 11, the display apparatus 10 of the example shown in FIG. 9A and FIG. 9B can be manufactured for example. Therefore, the holding member 4 shown in FIG. 11 has an L-shaped cross-sectional shape at each edge of the frame-like shape. The method for manufacturing display apparatus according to the present embodiment also may include connecting the wiring 9 with the display panel 3 in which the holding member 4 is provided at a part of or the entire of the outer edge of the display panel 3 so as to cover the connection part between the display panel 3 and the wiring 9. In other words, when the holding member 4 and the supporting member 5 are bonded to each other, the connection part between the display panel 3 and the wiring 9 is housed in the concave portion 4a (FIG. 9B) formed at a portion at which the holding member 4 and the wiring 9 face each other. In the present embodiment, the holding member 4 may be provided at the outer edge of the display panel 3 substantially at the same time when the substrate 2 of the display panel 3 is placed on the surface 5a of the supporting member 5 or after the substrate 2 is placed on the surface 5a. In addition, in the example shown in FIG. 11, the holding member 4 does not abut on the supporting member 5 at the portion facing the wiring 9, and thus, the adhesive 8 is not provided at the entire of the outer edge of the display panel 3 but applied or disposed so as to have a discontinuous portion 8a.

In addition, the present embodiment is different from the example shown in FIG. 1 in that the holding member 4 is engaged with the display panel 3 from a surface of the display panel 3, on which the wiring 9 has been connected. In the present embodiment, the holding member 4 has an L-shaped cross-sectional shape at each edge as described above and thus it can be engaged with the display panel 3 from a position facing a surface of the display panel 3 on which the wiring 9 is connected. Therefore, engaging the holding member 4 with the display panel 3, bonding the holding member 4 to the supporting member 5, and bringing the substrate 2 of the display panel 3 into close contact with the surface 5a of the supporting member 5 can be efficiently carried out. As shown in FIG. 10 described above, in the method for manufacturing display apparatus according to the present embodiment, the weak adhesive layer 6 may not always be formed. In other words, the display panel 3 and the supporting member 5, as described above, may be brought into close contact with each other by such as the press with the holding member 4, the electrostatic action, or the decompression adsorbing action.

Figure 12:
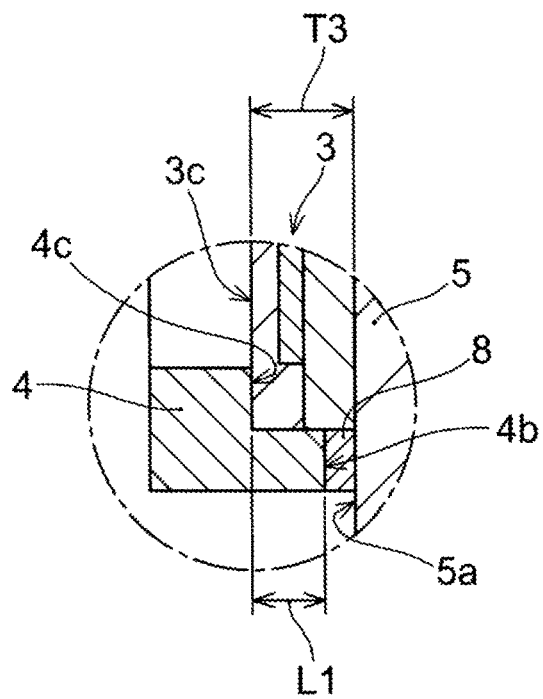
FIG. 12 shows an enlarged view of a portion XII of FIG. 10.

In FIG. 12, an enlarged view of the portion XII in FIG. 10 is shown. In the display apparatus 10a shown in FIG. 10, a dimension L1 in FIG. 12 is set at an appropriate length, and the display panel 3 can be thereby pressed towards the supporting member 5. In this manner, the display panel 3 and the supporting member 5 can be brought into close contact with each other. The dimension L1 is a length from a surface 4b to a surface 4c in the holding member 4 in which the surface 4b is a surface facing the supporting member 5 and the surface 4c is a surface abutting on the top surface 3c of the display panel 3. Here, in a case where the display panel 3 is pressed at a pressure of 1 hPa (Fa1) or more and 1,013 hPa (Fa2) or less, the display panel 3 and the supporting member 5 can be brought into appropriate close contact with each other without applying an excessive load to the display panel 3. Therefore, in a case where the thickness of the adhesive 8 is thin enough to ignore, the dimension L1 is set at a length of T3×E4/(Fa2×A3/A4+E4) mm or more and T3×E4/(Fa1×A3/A4+E4) mm or less, and the display panel 3 can be thereby appropriately pressed by the holding member 4. T3 is a thickness (unit: mm) of the display panel 3: E4 is a Young modulus (unit: hPa) of the holding member 4; and A3 is an area (unit: m$^2$) of the display panel 3. Further, A4 is a cross-sectional area (unit: m$^2$) of a portion of the holding member 4, which stretches when the holding member 4 is bonded to the supporting member 5 while engaging with the display panel 3 (for example, a cross-sectional area of the holding member 4 at the arrows C in FIG. 10).

The cross-sectional shape of each edge of the holding member 4 is not limited to the shapes shown in FIG. 3, FIG. 9B, and FIG. 10, and may be any shape which is capable of engaging with the periphery of the display panel 3. For example, the holding member 4 may not have a cross-sectional shape at each edge, such as U-shape or L-shape which is suitable for engaging with the display panel 3. For example, in a case where the holding member 4 is an elastic body, the edge of the display panel 3 may bite into the interior wall of the holding member 4 when the holding member 4 is engaged with the display panel 3, thereby holding the display panel 3. In addition, the holding member 4 may hold the display panel 3 merely by way of frictional force between the interior wall of the holding member 4 and the edge of the display panel 3.

Figure 13:
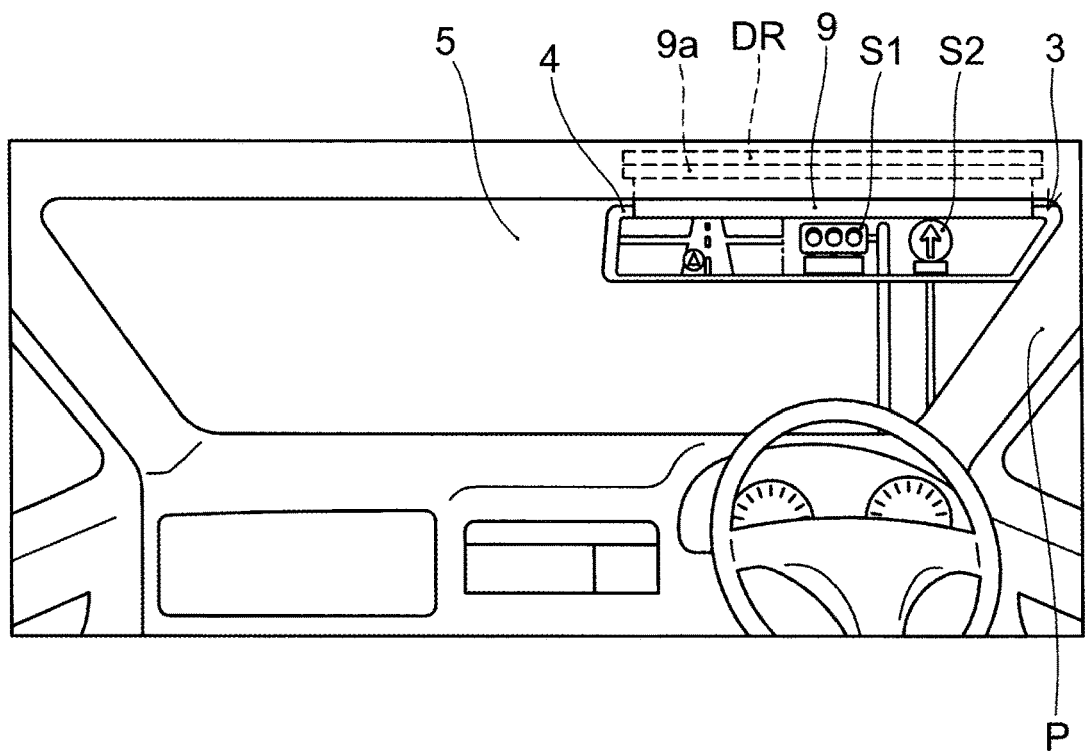
FIG. 13 shows an example of a display apparatus manufactured by the method for manufacturing display apparatus according to the embodiment of the present invention, in which the supporting member is a windshield for vehicle.

FIG. 13 shows an example in which a vehicle windshield is used for the supporting member 5 in the method for manufacturing display apparatus according to the embodiment. In other words, the display panel 3 is held by the holding member 4 on a surface of the windshield as the supporting member 5, the surface facing an interior of the vehicle. In addition, the display panel 3 in the example shown in FIG. 13 is a transparent organic EL display panel formed using a light transmissive material, and in a right side region of the display panel 3 in FIG. 13, light emission of the display elements 3a (refer to FIG. 2) is stopped. Thus, a front side scene, through the windshield, including such as a signal S1 and a variety of traffic signs S2 is visible in the right side region of the display panel 3. Meanwhile, in a left side region of the display panel 3 in FIG. 13, an image produced by a navigation system is displayed by driving the display elements 3a. The display panel 3 may be capable of partially displaying an image on the display screen as in the example of FIG. 13 or not capable of generating such a partial display. In addition, the display panel 3 can be held at any position of the windshield which is the supporting member 5. For example, the display panel 3 having a transverse width which is equivalent to a full width of the windshield may be held in the vicinity of an upper edge or a lower edge of the windshield throughout a vehicle width direction. Further, in addition to the display panel 3 shown in FIG. 13, a display panel other than the display panel 3 of FIG. 13 may be held on a region of the windshield which is in front of a passenger seat with the display screen directed to the passenger seat.

Although in the example of FIG. 13, the frame-like holding member 4 having four edges is provided as in the example of FIG. 2 described above, the holding member 4 may be provided only at two of opposing edges or arbitrary edges of the display panel 3 or may be provided at arbitrary three or only one edge of the display panel 3. For example, it may be preferable that the holding member 4 is provided only at the edge adjacent to the upper edge of the windshield or at the edge adjacent to a pillar P. This is because these edges are considered to be inconspicuous for eyes of a person in the interior of the vehicle.

In the example of FIG. 13, the wiring 9 extends to a space between an upholstery material of the ceiling part in the interior of the vehicle and a roof of the vehicle at an upper edge of the windshield. The wiring 9 is inserted into a connector 9a disposed between the upholstery material of the ceiling part and the roof of the vehicle. The connector 9a is coupled to a driver DR to supply a drive signal to the display panel 3. By way of such arrangement, a length of the wiring 9 can be reduced. Also, exposure of the wiring 9 inside the interior of the vehicle can be reduced. In a case where the vehicle windshield is used as the supporting member 5, the method for manufacturing display apparatus according to Embodiment 1 and Embodiment 2 may comprise connecting the wiring 9 to electronic components arranged at the ceiling part in the interior of the vehicle and configured to function as a driver and the method may comprise covering the driver with the upholstery material thereafter.

On the display panel 3, any image can be displayed without being limited to the image from the navigation system. For example, an image on a television, an image recorded in any medium such as a DVD, and an image captured by an imaging element connected to the display panel 3 may be displayed on the display panel 3.

As in the example of FIG. 13, in a case where the supporting member 5 is the vehicle windshield and the display panel 3 is the transparent organic EL display panel, by appropriately controlling light emission from the display elements 3a, the view in front of vehicle can be recognized through the display panel 3 from the inside of the interior of the vehicle (such as driver seat, for example) as well as any information can be displayed on the display panel 3. In addition, according to the method for manufacturing display apparatus of the present embodiment, if either the windshield (supporting member 5) or the display panel 3 is damaged, the display panel 3 can be detached from the windshield without causing severe damage to the unbroken display panel 3 or unbroken windshield. Therefore, it may enable to continuously use the unbroken display panel 3 or unbroken windshield.

Figure 14A:
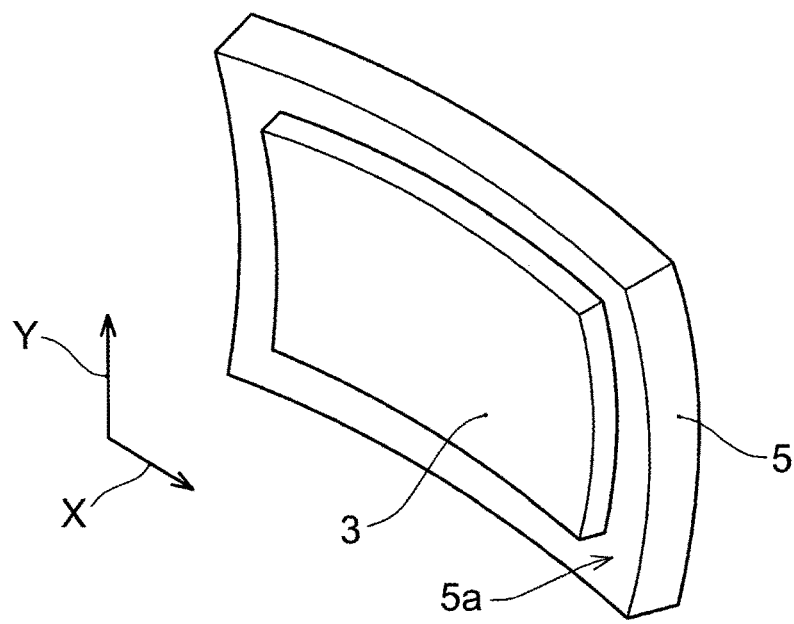
FIG. 14A shows a schematic view of an example in which a surface of the supporting member is a quadratic surface.

In a case where the supporting member 5 is the vehicle windshield, the surface 5a of the supporting member 5, on which the display panel 3 is placed, may be a quadratic surface as shown in FIG. 14A. FIG. 14A schematically shows the display panel 3 and the supporting member 5 having the surface 5a which is the quadratic surface. In addition, in FIG. 14B, there is schematically shown a cross section obtained by cutting the supporting member 5 and the display panel 3 placed on the surface 5a that is the quadratic surface along a plane parallel to the thickness direction of the display panel 3. In FIG. 14A, the supporting member 5 is curved in such a way that the surface 5a becomes concave surface in both of the X direction and the Y direction. The display panel 3 that can have flexibility is also curved in conformity with the curved shape of the supporting member 5. However, the surface 5a of the supporting member 5 is the quadratic surface and thus it is inferred that the display panel 3 cannot bend in the same manner as the curved shape of the supporting member 5. In that case, in the display panel 3, a portion lifting up from the supporting member 5 may be produced.

Figure 14B:
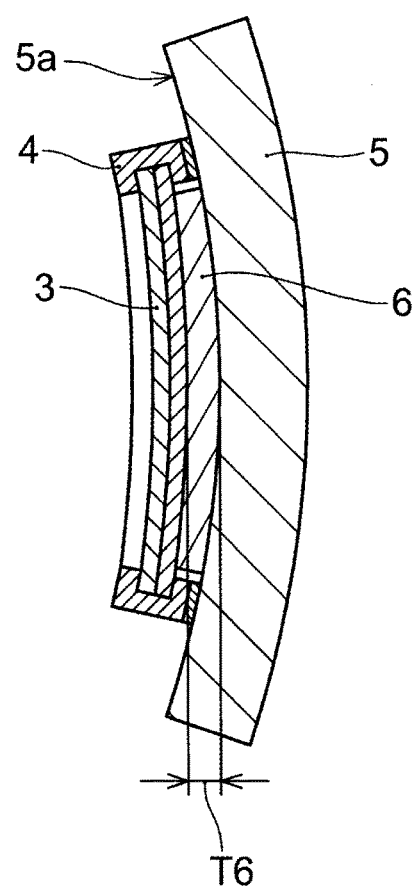
FIG. 14B shows a cross section of the display panel placed on the quadratic surface.

However, by providing the weak adhesive layer 6, as shown in FIG. 14B, a thickness T6 of the weak adhesive layer 6 can vary at every position in the display panel 3 based on the curved shape of the quadratic surface, and the state of close contact between the display panel 3 and the supporting member 5 via the weak adhesive layer 6 can be thereby obtained. When the holding member 4 engaging with the display panel 3 is bonded to the supporting member 5, a surface of the weak adhesive layer 6, which faces the display panel 3, is pressurized by uneven pressure due to the difference in curved shape between the display panel 3 and the supporting member 5. Thus, the weak adhesive layer 6, at a portion at which a gap between the display panel 3 and the supporting member 5 is narrow, can contract more than a portion at which a gap therebetween is wider. Also, a part of weak adhesive agent constituting the weak adhesive layer 6, which is in the portion of the weak adhesive layer 6 where the gap between the display panel 3 and the supporting member 5 is narrow, can be extruded to the portion of the weak adhesive layer 6 where the gap is wider. Consequently, the thickness T6 of the weak adhesive layer 6 can vary depending on each position in the display panel 3, based on the curved shape of the quadratic surface in the surface 5a of the supporting member 5. Providing the weak adhesive layer 6 in this manner enables to make a close contact between the display panel 3 and the supporting member 5 even when the surface 5a of the supporting member 5 is the quadratic surface.

SUMMARY

A method for manufacturing display apparatus according to a first aspect of the present invention is characterized by comprising: forming a display panel by forming a plurality of display elements on a substrate having flexibility; providing a holding member at a part of or the entire of an outer edge of the display panel along the outer edge, the holding member engaging with an outer periphery of the display panel; preparing a supporting member having a surface on which the substrate of the display panel is to be placed; placing the substrate on the surface of the supporting member; bonding the holding member to the surface of the supporting member; and bringing the substrate into close contact with the surface of the supporting member at a strength lower than a bonding strength between the holding member and the surface of the supporting member.

According to the configuration of the first aspect of the present invention, it is possible to manufacture a display apparatus in which a display panel to be used being fixed to a supporting member can be easily detached from the supporting member.

A method for manufacturing display apparatus according to a second aspect of the present invention, in the first aspect, may further comprising forming a barrier layer, at either one of or both of between the substrate and the display elements and on the display elements, by depositing at least two layers using a moisture impermeable material.

According to the configuration of the second aspect of the present invention, it is possible to provide a display apparatus with less permeation of moisture reaching an interface between the display panel and the supporting member.

A method for manufacturing display apparatus according to a third aspect of the present invention, in the first or second aspect, may further comprising forming a weak adhesive layer composed of an adhesive agent on the surface of the supporting member or on a surface of the substrate opposite to a surface facing the display elements, wherein the substrate may be brought into close contact with the surface of the supporting member via the weak adhesive layer.

According to the configuration of the third aspect of the present invention, it is possible to provide a display apparatus in which the display panel and the supporting member substantially securely brought into close contact with each other.

A method for manufacturing display apparatus according to a fourth aspect of the present invention, in the third aspect, may further comprising providing a strong adhesive layer between the weak adhesive layer and the substrate or between the weak adhesive layer and the supporting member, the strong adhesive layer having an adhesive force equal to or more than an adhesive force of the weak adhesive layer.

According to the configuration of the fourth aspect of the present invention, it becomes clear to which the weak adhesive layer remains, the display panel or the supporting member, and thus workability at the time of replacement of the display panel can be improved.

In a method for manufacturing display apparatus according to a fifth aspect of the present invention, in any one of the first to fourth aspects, providing the holding member may comprise: preparing a frame-shaped body to be the holding member, the frame-shaped body having a groove on an interior wall, and inserting an outer edge part of the display panel into the groove prior to a placement of the substrate on the surface of the supporting member.

According to the configuration of the fifth aspect of the present invention, the display panel can be placed on the supporting member in a state in which the display panel is combined with the holding member, enabling an easy handling of the display panel.

A method for manufacturing display apparatus according to a sixth aspect of the present invention, in any one of the first to fourth aspects, may further comprise connecting a wiring to the display panel, wherein the holding member may be provided at a part of or the entire of the outer edge of the display panel so as to cover a connection part between the display panel and the wiring.

According to the configuration of the sixth aspect of the present invention, connection part between the wiring and the display panel can be protected from an external stress by the holding member. In addition, the connection part is hidden inside the holding member, and the appearance of the display apparatus may be thereby improved.

In a method for manufacturing display apparatus according to a seventh aspect of the present invention, in any one of the first to sixth aspects, the holding member may be provided in a frame-like shape along the entire of the outer edge of the display panel, and a suction port may be formed at the holding member, the suction port communicating with inside of the frame-like shape of the holding member and communicating with outside of the frame-like shape of the holding member; and the substrate may be brought into close contact with the surface of the supporting member by suctioning gas from the inside of the frame-like shape of the holding member by using the suction port after bonding the holding member to the surface of the supporting member.

According to the configuration of the seventh aspect of the present invention, the substrate of the display panel can be much better brought into close contact with the supporting member. In addition, it is possible to prevent penetration of the air or the moisture therein inside a space in the holding member to an interface between the display panel and the supporting member.

DESCRIPTION OF REFERENCE NUMERAL

1, 10, 10*a* Display apparatus
2 Substrate
3 Display panel
37 First barrier layer
37*a* Silicon nitride layer
37*b* Silicon oxide layer
38 Second barrier layer
38*a* Silicon nitride layer
38*b* Silicon oxide layer
38*c* Organic layer
3*a* Display element
4 Holding member
4*d* Groove
5 Supporting member
5*a* Surface
6 Weak adhesive layer
7 Strong adhesive layer
8 Adhesive
9 Wiring
9*a* Connector
DR Driver

The invention claimed is:

1. A method for manufacturing a display apparatus comprising:
   forming a display panel by forming a plurality of display elements on a substrate having flexibility;
   preparing a holding member to be engaged with an outer periphery of the display panel;
   preparing a supporting member having a surface on which the substrate of the display panel is to be placed;
   placing the substrate on the surface of the supporting member;
   bonding the holding member to the surface of the supporting member;
   bringing the substrate into close contact with the surface of the supporting member at a strength lower than a bonding strength between the holding member and the surface of the supporting member; and
   engaging the holding member with an entire of an outer edge of the display panel before or after or simultaneously with placing the substrate on the surface,
   wherein the holding member is prepared so as to have a frame shape along the entire of the outer edge of the display panel, and a suction port is formed at the holding member, the suction port communicating with inside of the frame shape of the holding member and communicating with outside of the frame shape of the holding member; and
   the substrate is brought into close contact with the surface of the supporting member by suctioning gas from the inside of the frame shape of the holding member by using the suction port after bonding the holding member to the surface of the supporting member.

* * * * *

UNITED STATES PATENT AND TRADEMARK OFFICE
CERTIFICATE OF CORRECTION

PATENT NO. : 10,658,627 B2  
APPLICATION NO. : 15/763201  
DATED : May 19, 2020  
INVENTOR(S) : Katsuhiko Kishimoto Page 1 of 1

It is certified that error appears in the above-identified patent and that said Letters Patent is hereby corrected as shown below:

On the Title Page

Item (87), Line 02, delete "Mar. 14, 2018" and insert therefor --Mar. 14, 2019--.

Signed and Sealed this  
Fifteenth Day of September, 2020

Andrei Iancu  
*Director of the United States Patent and Trademark Office*